United States Patent
Park et al.

(10) Patent No.: US 11,102,899 B2
(45) Date of Patent: Aug. 24, 2021

(54) ELECTRONIC DEVICE INCLUDING WATERPROOF STRUCTURE

(71) Applicant: Samsung Electronics Co., Ltd., Gyeonggi-do (KR)

(72) Inventors: Sung Eun Park, Gyeonggi-do (KR); Jeong Eun Kim, Gyeonggi-do (KR); Jae Uk Ahn, Incheon (KR); Jong Cheon Wee, Gyeonggi-do (KR); Hyung Woo Lee, Seoul (KR); Sang Hyuck Jung, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 15/691,016

(22) Filed: Aug. 30, 2017

(65) Prior Publication Data
US 2018/0063981 A1    Mar. 1, 2018

(30) Foreign Application Priority Data
Aug. 30, 2016   (KR) .......................... 10-2016-0111160

(51) Int. Cl.
*H05K 5/00* (2006.01)
*H05K 5/06* (2006.01)
(Continued)

(52) U.S. Cl.
CPC .......... *H05K 5/069* (2013.01); *G04B 39/025* (2013.01); *G04G 17/08* (2013.01); *H04R 1/023* (2013.01);
(Continued)

(58) Field of Classification Search
None
See application file for complete search history.

(56) References Cited

U.S. PATENT DOCUMENTS

| | | | |
|---|---|---|---|
| 5,033,035 A * | 7/1991 | Affolter | G04B 39/02 368/294 |
| 6,762,976 B1 | 7/2004 | Tamaru et al. | |

(Continued)

FOREIGN PATENT DOCUMENTS

| | | |
|---|---|---|
| CH | 703918 | 4/2012 |
| JP | 2002-275201 | 9/2002 |

(Continued)

OTHER PUBLICATIONS

International Search Report dated Dec. 20, 2017 issued in counterpart application No. PCT/KR2017/009501, 15 pages.

(Continued)

*Primary Examiner* — Anthony Q Edwards
*Assistant Examiner* — Rashen E Morrison
(74) *Attorney, Agent, or Firm* — The Farrell Law Firm, P.C.

(57) ABSTRACT

An electronic device includes a display, an upper housing surrounding at least a portion of a periphery of the display, a lower housing coupled to the upper housing, and a window waterproof member disposed between at least a portion of a periphery of the display and the upper housing to seal an aperture between the upper housing and the display. The window waterproof member includes an inner core having a specific strength, and an outer sheath having a specific elasticity, and an outer peripheral surface of which contacts at least part of the upper housing and an inner peripheral surface of which contacts at least part of the display while the outer sheath surrounding at least a portion of the inner core.

16 Claims, 21 Drawing Sheets

(51) Int. Cl.
*H05K 5/02* (2006.01)
*H04R 1/02* (2006.01)
*G04B 39/02* (2006.01)
*G04G 17/08* (2006.01)
*H04R 1/08* (2006.01)

(52) U.S. Cl.
CPC ........... *H04R 1/028* (2013.01); *H05K 5/0004* (2013.01); *H05K 5/0017* (2013.01); *H05K 5/0247* (2013.01); *H04R 1/086* (2013.01); *H04R 2201/023* (2013.01); *H04R 2499/11* (2013.01)

(56) References Cited

U.S. PATENT DOCUMENTS

| | | | | |
|---|---|---|---|---|
| 7,561,684 | B2 | 7/2009 | Tsutaichi et al. | |
| 7,889,139 | B2* | 2/2011 | Hobson | H01Q 1/243 343/702 |
| 9,442,525 | B2 | 9/2016 | Choi et al. | |
| 9,625,944 | B2* | 4/2017 | Weber | G06F 1/163 |
| 9,723,737 | B2* | 8/2017 | Lee | G06F 1/1656 |
| 9,829,216 | B2* | 11/2017 | Prutsman | F24S 70/225 |
| 10,735,043 | B2* | 8/2020 | Cha | H01Q 1/24 |
| 2006/0258325 | A1 | 11/2006 | Tsutalchi et al. | |
| 2008/0081679 | A1* | 4/2008 | Kawasaki | H04B 1/3888 455/575.8 |
| 2008/0316116 | A1* | 12/2008 | Hobson | H01Q 9/0421 343/702 |
| 2009/0080153 | A1* | 3/2009 | Richardson | A45C 13/002 361/679.56 |
| 2010/0203931 | A1* | 8/2010 | Hynecek | H04M 1/0202 455/575.8 |
| 2014/0231132 | A1* | 8/2014 | Watanabe | H02G 15/013 174/650 |
| 2014/0305425 | A1* | 10/2014 | Prutsman | F24S 10/748 126/635 |
| 2015/0062787 | A1* | 3/2015 | Wilson | H04M 1/185 361/679.01 |
| 2015/0241916 | A1 | 8/2015 | Choi et al. | |
| 2015/0350393 | A1* | 12/2015 | Midori | H04B 1/3888 455/575.8 |
| 2016/0010692 | A1 | 1/2016 | Yonekura | |
| 2017/0201826 | A1* | 7/2017 | Zhang | H05K 5/0213 |
| 2018/0063981 | A1* | 3/2018 | Park | H05K 5/0017 |
| 2018/0110148 | A9* | 4/2018 | Jun | H04M 1/035 |
| 2019/0072903 | A1* | 3/2019 | Park | H05K 5/061 |

FOREIGN PATENT DOCUMENTS

| | | |
|---|---|---|
| JP | 2016017578 | 2/2016 |
| KR | 1020010043047 | 5/2001 |
| KR | 10-20070018463 | 2/2007 |
| KR | 1020090088239 | 8/2009 |
| KR | 10-20140016052 | 2/2014 |
| KR | 10-1437531 | 9/2014 |
| KR | 1020150099079 | 8/2015 |
| KR | 10-20150118452 | 10/2015 |
| WO | WO 84/02203 | 6/1984 |

OTHER PUBLICATIONS

European Search Report dated Jul. 23, 2019 issued in counterpart application No. 17847001.9-1003, 9 pages.

* cited by examiner

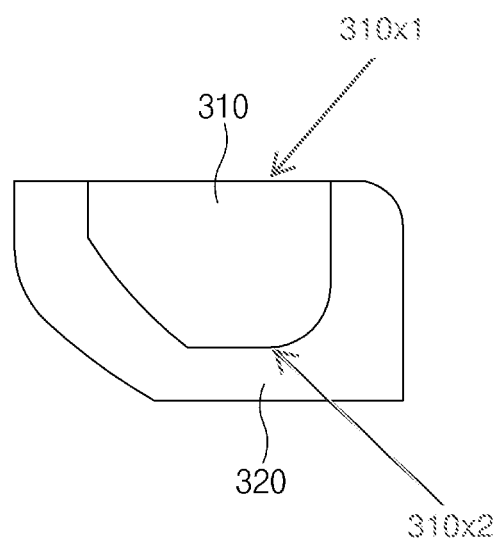
FIG. 5A1
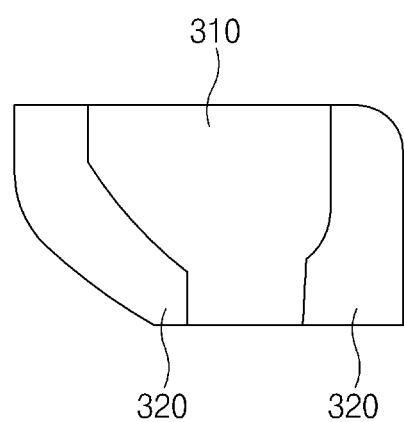
FIG. 5A2

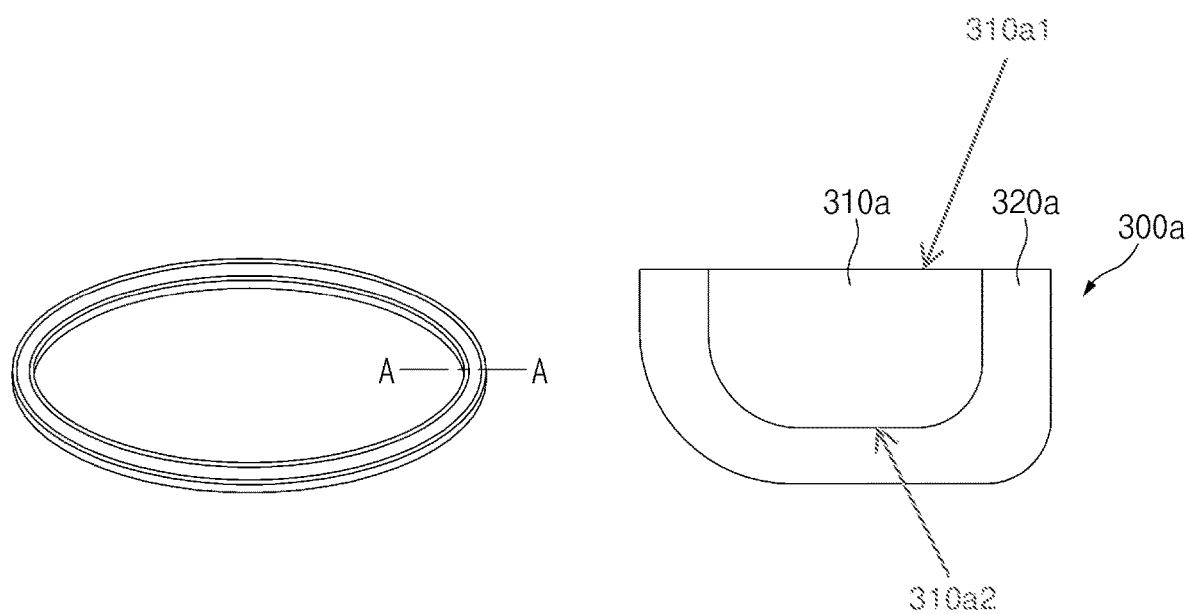
FIG. 5B1
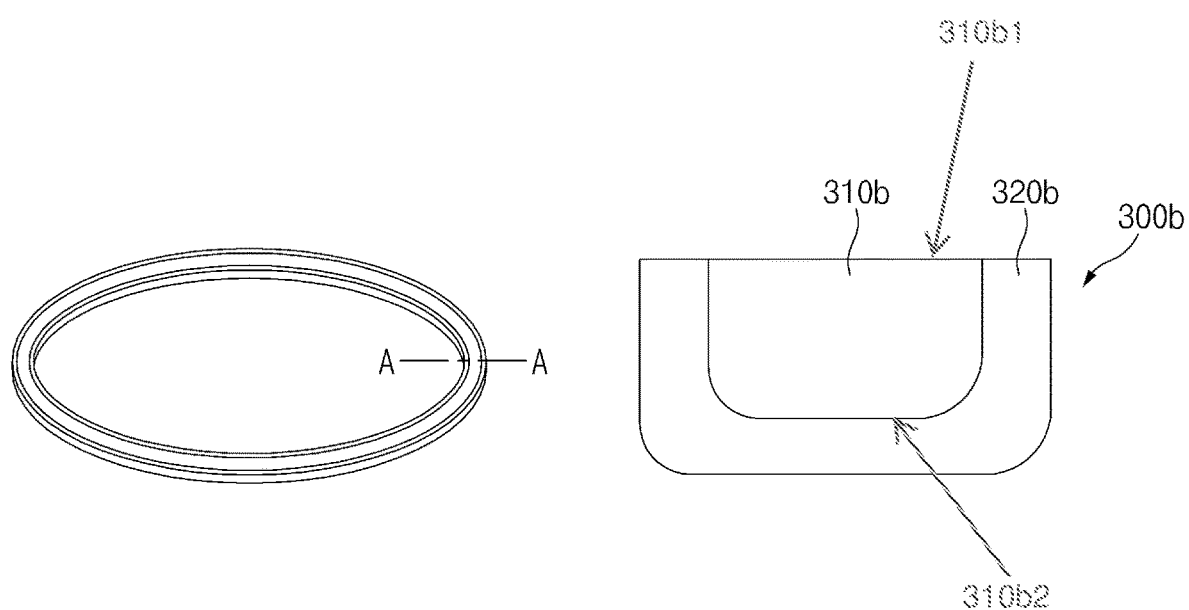
FIG. 5B2

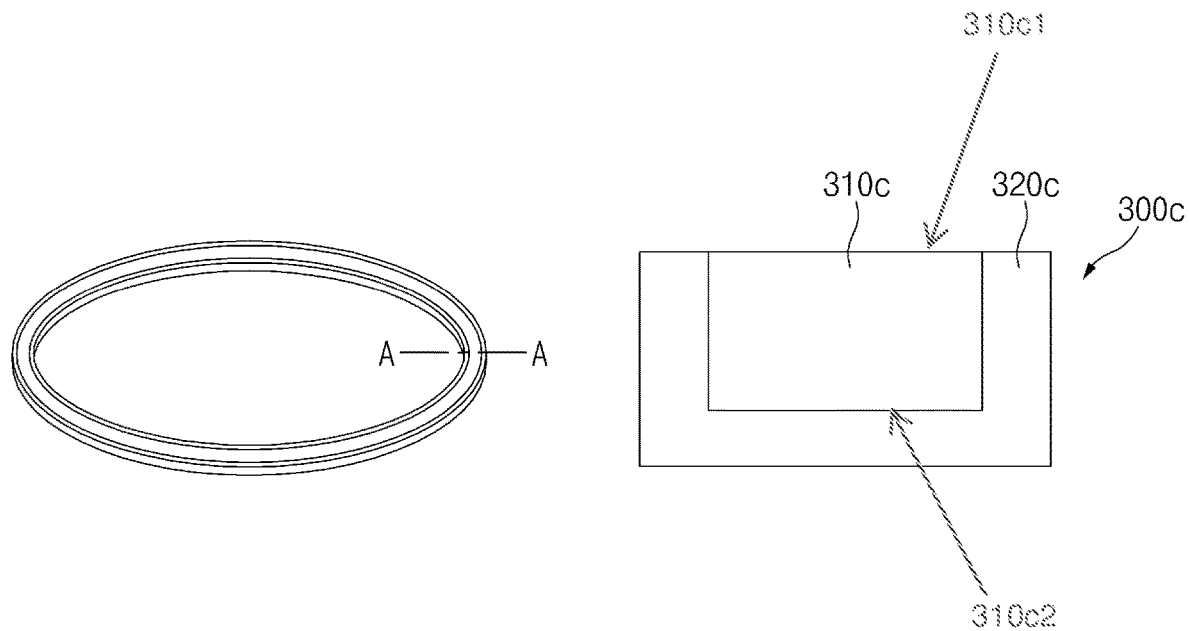
FIG. 5B3
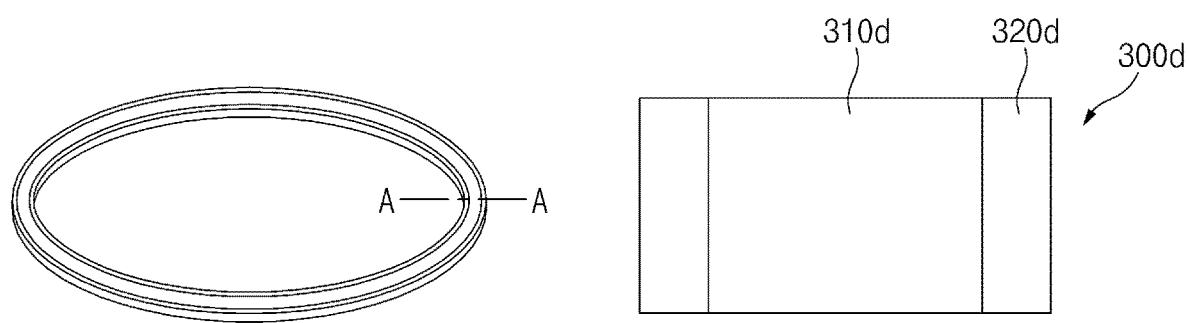
FIG. 5B4

ELECTRONIC DEVICE INCLUDING WATERPROOF STRUCTURE

CROSS-REFERENCE TO RELATED APPLICATIONS

This application claims the benefit under 35 U.S.C. § 119(a) of a Korean patent application filed on Aug. 30, 2016 in the Korean Intellectual Property Office and assigned Serial number 10-2016-0111160, the entire disclosure of which is hereby incorporated by reference.

TECHNICAL FIELD

The present disclosure relates to a waterproof structure of an electronic device.

BACKGROUND

Conventionally, portable electronic devices are manufactured and sold in various forms, for example, in a form in which the electronic devices are gripped by hands, a form in which the electric devices are fastened on wrists or hung on the necks of the user.

At least a portion of such an electronic device that is fastened on the wrist or hung on the neck is exposed to the outside such that water or sweat generated in the body of the user permeates into the electronic device.

SUMMARY

Aspects of the present disclosure are to address at least the abovementioned problems and/or disadvantages and to provide at least the advantages described below. Accordingly, an aspect of the present disclosure is to provide an electronic device including a waterproof structure that may stably maintain an operable physical state of an electronic device while providing a waterproof function of the electronic device.

In accordance with an aspect of the present disclosure, an electronic device is provided. The electronic device may include a display, an upper housing disposed at least a portion of a periphery of the display, a lower housing couple-d to the upper housing and a window waterproof member disposed between at least a portion of a periphery of the display and the upper housing and sealing an aperture between the upper housing and the display, wherein the window waterproof member may include an inner core having a specific strength and an outer sheath having a specific elasticity, and an outer peripheral surface of which contacts at least part of the upper housing and an inner peripheral surface of which contacts at least part of the display while the outer sheath surrounding at least a portion of the inner core.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 5A1 and 5A2 are a view illustrating an example of a section of a window waterproof structure according to an embodiment of the present disclosure;

FIGS. 5B1, 5B2, 5B3, and 5B4 are a view illustrating various forms of a window waterproof structure according to an embodiment of the present disclosure;

Throughout the drawings, it should be noted that like reference numbers are used to depict the same or similar elements, features, and structures.

DETAILED DESCRIPTION

Figure 1:
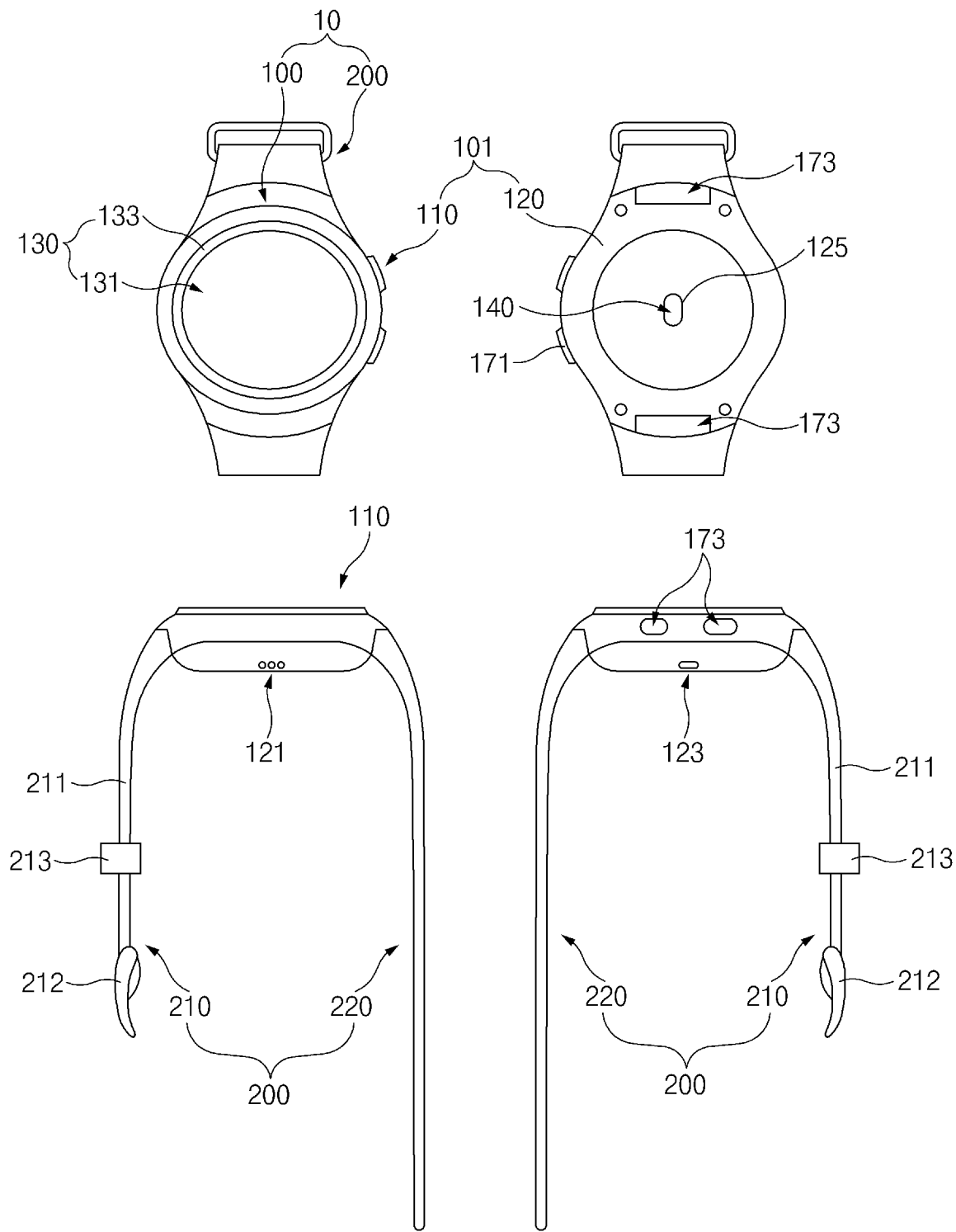
FIG. 1 is a view illustrating an example of an electronic device according to an embodiment of the present disclosure.

Various embodiments of the present disclosure may be described with reference to accompanying drawings.

Accordingly, those of ordinary skill in the art will recognize that modification, equivalent, and/or alternative on the various embodiments described herein can be variously made without departing from the scope and spirit of the present disclosure. With regard to description of drawings, similar elements may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like.

According to another embodiment, the electronic devices may be home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, or the like.

According to another embodiment, the photographing apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like).

According to another embodiment, the electronic devices may include at least one of parts of furniture or buildings/structures, electronic boards, electronic signature receiving devices, projectors, or various measuring instruments (e.g., water meters, electricity meters, gas meters, or wave meters, and the like). In the various embodiments, the electronic device may be one of the above-described various devices or a combination thereof. An electronic device according to an embodiment may be a flexible device. Furthermore, an electronic device according to an embodiment may not be limited to the above-described electronic devices and may include other electronic devices and new electronic devices according to the development of technologies.

Hereinafter, an electronic device according to the various embodiments may be described with reference to the accompanying drawings. The term "user" used herein may refer to a person who uses an electronic device or may refer to a device (e.g., an artificial intelligence electronic device) that uses an electronic device.

Figure 2A:
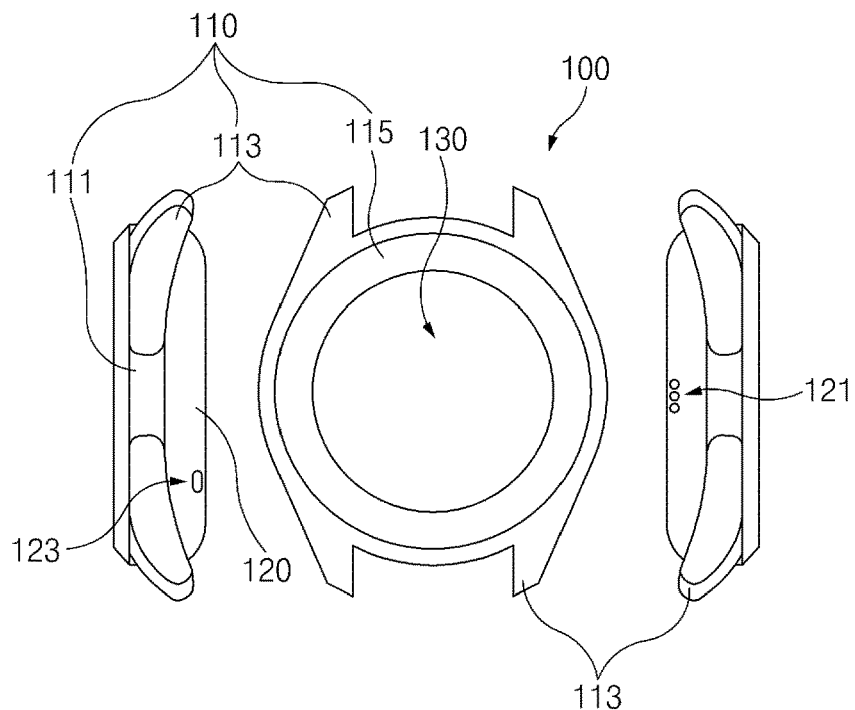
FIGS. 2A and 2B are a view illustrating an example of a body of an electronic device according to an embodiment of the present disclosure.
Figure 2B:
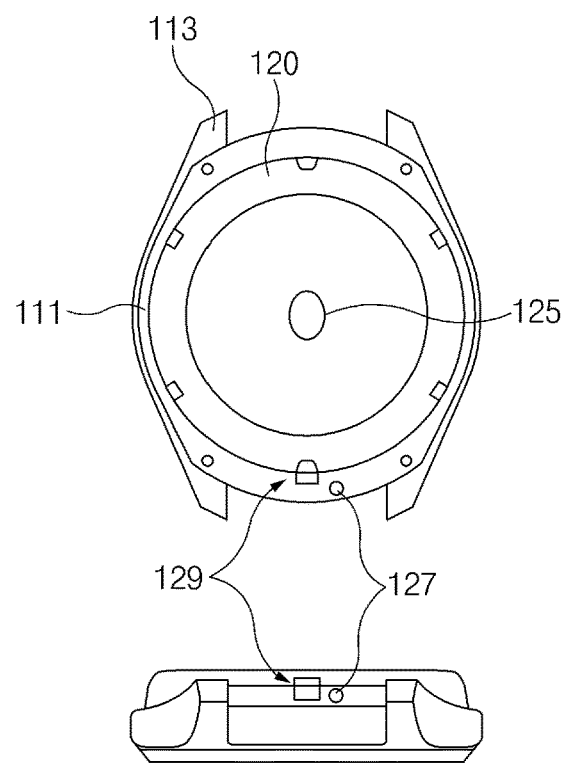

FIG. 1 is a view illustrating an example of an electronic device according to an embodiment of the present disclosure. FIGS. 2A and 2B are a view illustrating an example of a body of an electronic device according to an embodiment of the present disclosure.

Referring to FIGS. 1, 2A, and 2B, the electronic device 10 according to an embodiment of the present disclosure may include a body 100 and a mounting part 200.

The body 100, for example, may include a housing 101 and a display 130. According to various embodiments, at least one of a printed circuit board, on which a processor related to driving of the display 130 and a memory, a battery configured to supply electric power to the printed circuit board, a speaker configured to output an audio signal, a microphone configured to collect an audio signal, at least one physical button (e.g., a side button 171) configured to generate an input signal according to input by the user, at least one sensor 140, and a charging interface unit may be included inside the housing 101. When the printed circuit board or the battery, which has been described above, may be seated inside the housing 101 and is covered by the display 130, it may not be observed from the outside. At least a portion of the sensor 140, for example, may be exposed to the outside through one side of the housing 101. In this regard, a first sensor hole 125 may be formed at a peripheral portion of the housing 101 (e.g., a lower housing 120), in which the sensor 140 is disposed, such that at least a portion of the sensor 140 may be exposed. The sensor 140 may perform photographing of an image related to pulses or blood flows of the user through the first sensor hole 125. According to various embodiments, a second sensor hole 129 related to an atmospheric pressure sensor may be disposed on one side of the lower housing 120. According to various embodiments, a mounting part attaching/detaching button 173 related to a mounting function of the mounting part 200 may be provided on one side of the body 100.

The housing 101, for example, may include an upper housing 110 and a lower housing 120.

The upper housing 110 may include an upper body 111, a peripheral part 115 having an opened area at a central portion thereof such that at least a portion of the display 130 may be exposed to the outside at an upper end of the upper body 111, and a connecting part 113 disposed on one side of the upper body 111 and connected to the mounting part 200. The upper housing 110 may be disposed such that the peripheral part 115 surrounds a periphery of the display 130. An opened area of the upper housing 110 may have various shapes such as a circular shape, an elliptical shape, a tetragonal shape, or a polygonal shape in correspondence to the shape of the display 130. The peripheral part 115 (e.g., a wheel or a bezel) of the upper housing 110, for example, may be disposed to correspond to the shape of the display 130. The peripheral part 115, for example, may be arranged to be rotatable, and may generate a specific input signal as the peripheral part 115 rotates and may deliver the input signal to a processor.

The lower housing 120 is coupled to the upper housing 110, and may function to protect device elements (e.g., the printed circuit board and the battery (or a power source)) disposed inside the lower housing 120. At least one hole may be disposed on one side of the lower housing 120. The at least one hole, for example, may include a speaker hole 121 through which an audio signal generated by the speaker is output, a microphone hole 123 by which the microphone collects an audio signal, and a first sensor hole 125 through which a sensor signal of the sensor 140 is output and configured to receive a signal (e.g., a reflection signal) related to the output sensor signal. Further, in relation to the sensing of the atmospheric pressure, the lower housing 120 may include a second sensor hole 129 through which air related to an external atmospheric pressure is introduced. An air vent hole 127 related to adjustment of an internal pressure of the electronic device 10 may be disposed on one side of the lower housing 120.

Although it is illustrated that the speaker hole 121 and the microphone hole 123 are formed on one side of the lower housing 120, the holes may be formed on one side of the upper housing 110. The lower housing 120 may include an opened area at the center thereof, and a rear case (e.g., a rear glass) may be disposed in the opened area. According to various embodiments, a separate opened area is not formed at the center of the lower housing 120 but the center of the lower housing 120 may be buried.

The electronic device 10 according to the embodiment of the present disclosure may include waterproof members that may support a waterproof function of at least one of the speaker hole 121 disposed in the housing 101, the microphone hole 123, the first sensor hole 125, the air vent hole 127, the second sensor hole 129. The waterproof members may be disposed on at least part of the speaker hole 121, the microphone hole 123, the sensor holes 125 and 129, and the air vent hole 127 to perform a waterproof function such that water is not introduced into the housing 101 through at least one hole.

At least a portion of the display 130 may be exposed through the opened area provided in the upper housing 110, and may output a specific functional screen in correspondence to control of the processor or control of a display driving circuit. The display 130, for example, may include an external protective member (e.g., a window or a window glass), a display panel, and a touch panel. Further, the display 130 may further include a heat radiating plate or an embossing layer configured to perform heat radiation and protection of the display panel. According to various embodiments, the electronic device 10 may further include a display driving circuit (e.g., a display driver IC (DDI)) related to driving of the display 130. The electronic device 10 according to an embodiment of the present disclosure may include a waterproof member configured to waterproof an aperture between the display 130 and the housing 101 (e.g., the upper housing 110). The waterproof member may prevent water, moisture, or foreign substances in the form of liquid from being introduced into the housing 101 from the outside while an aperture between the external protective member of the display 130 and the upper housing 110 has a specific elasticity.

The mounting part 200 may be coupled to a pair of connecting parts 113 provided on one side of the housing 101. The mounting part 200, for example, may include a first strap 210 connected to one side of the housing 101 and a second strap 220 connected to an opposite side of the housing 101. A short strap body 211, a buckle 212, and a band 213 may be disposed in the first strap 210, and a long strap body having at least one hole may be disposed in the second strap 220. Although it is illustrated that the mounting part 200 has a structure coupled by using a buckle, the present disclosure is not limited thereto. For example, the mounting part 200 may be formed in a Velcro type, a snap button type, or a bracelet type.

Figure 3A:
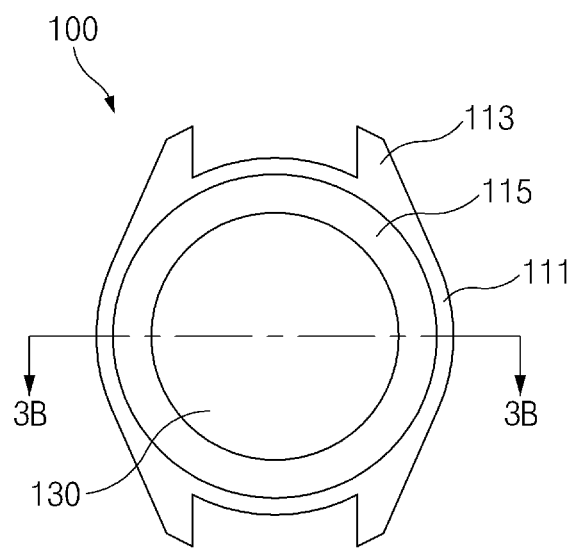
FIGS. 3A, 3B, and 3C are a view illustrating an example of a window waterproof structure of an electronic device according to an embodiment of the present disclosure.
Figure 3B:
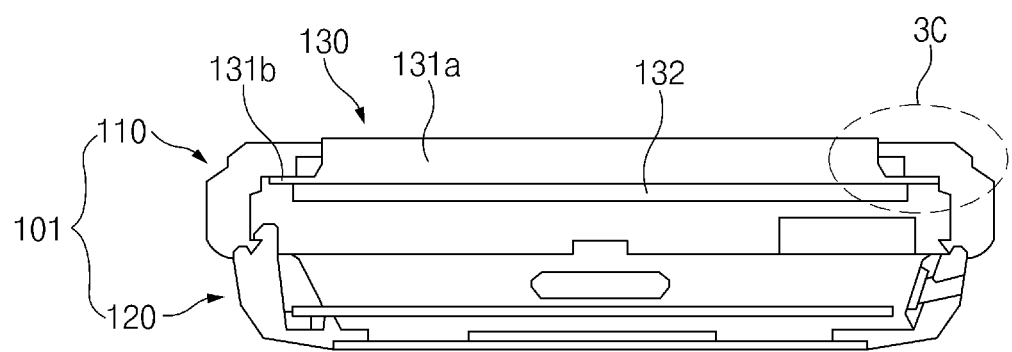
Figure 3C:
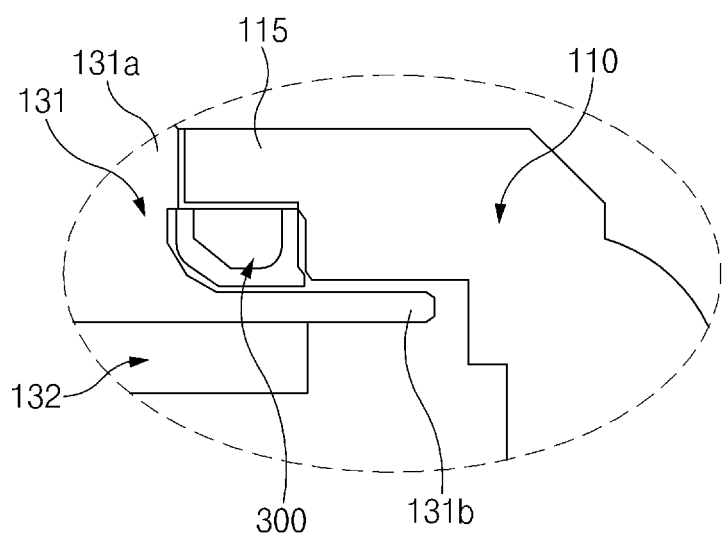

FIGS. 3A, 3B, and 3C are a view illustrating an example of a window waterproof structure of an electronic device according to an embodiment of the present disclosure.

Referring to FIGS. 3A, 3B, and 3C, the body 100 of the present disclosure may include a housing 101 (e.g., the upper housing 110 and the lower housing 120), and a display 130 (e.g., the external protective member 131 and the display panel 132). According to various embodiments, although the various device elements of the electronic device 10, which have been described above, may be disposed in the housing 101, the configurations are omitted for convenience of description.

The display 130 may include an external protective member 131, and an upper surface of the display 130 is wider than a lower surface thereof such that the external protective member 131 has an inverse T-shape or a hat shape. For example, the external protective member 131 may include a central part 131a and an edge 131b. The external protective member 131 may be formed of a transparent material such as glass, and may be disposed on the display panel 132. The central part 131a may be exposed to the outside through the opened area of the upper housing 110. The edge 131b may be disposed under the peripheral part 115 defining the opened area of the upper housing 110. As the peripheral part 115 of the upper housing 110 is disposed above the edge 131b of the external protective member 131 and the peripheral part 115 is formed in multiple stages, a space of a specific size may be disposed between the edge 131b and the peripheral part 115. When the body 100 has a circular shape as a whole except for the connecting part 113, a cavity (e.g., a circular cavity) may be formed between the edge 131b and the peripheral part 115.

A window waterproof member 300 (or a window waterproof part) may be disposed in a cavity formed between an upper side of the edge 131b of the external protective member 131 and a lower side of the peripheral part 115 of the upper housing 110. The window waterproof member 300 may have a size and a diameter that are larger enough to fill the circular cavity, and may have a shape that is similar to the circular cavity. The upper side of the window waterproof member 300 may form a flat surface, and the lower side of the window waterproof member 300 may have a circular band shape (or corresponding to an edge shape of the external protective member, such as a polygonal shape), at least a portion of which is curved. At least a portion of an inner peripheral surface (or an inner surface) of the window waterproof member 300 having a circular band shape may contact a side wall of the external protective member 131, and at least a portion of an outer peripheral surface (or an outer surface) of the window waterproof member 300 may contact an inside of the peripheral part 115 of the upper housing 110. Then, the inner peripheral surface and the outer peripheral surface of the window waterproof member 300 may be formed of an elastic material. Because at least a portion of the inner peripheral surface and the outer peripheral surface of the window waterproof member 300 while the window waterproof member 300 is disposed between the external protective member 131 and the upper housing 110, the elasticity of the side wall of the external protective member 131 and the peripheral part 115 is applied in a direction in which the side wall of the external protective member 131 and the peripheral part 115 are pushed so that a aperture between the external protective member 131 and the upper housing 110 may be sealed.

Figure 4:
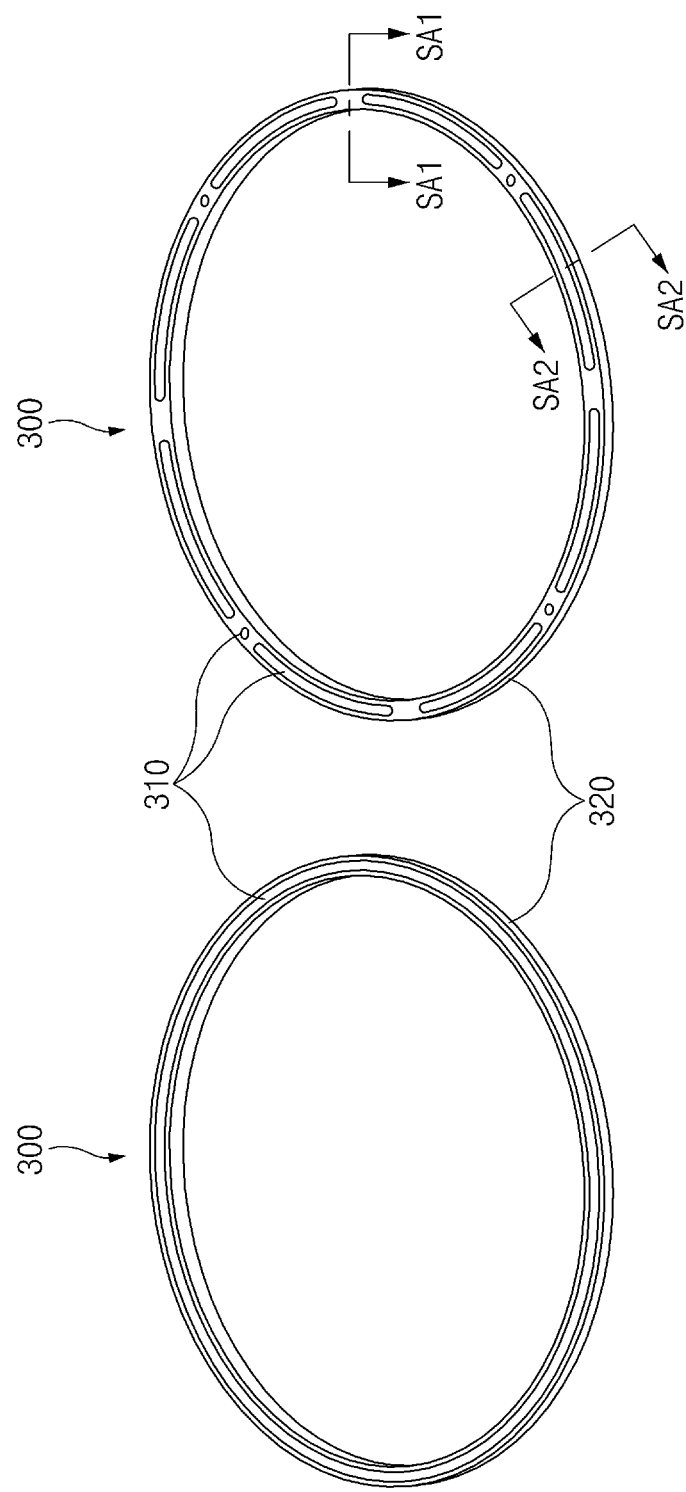
FIG. 4 is a view illustrating an example of a window waterproof structure according to an embodiment of the present disclosure.

FIG. 4 is a view illustrating an example of a window waterproof structure according to an embodiment of the present disclosure. FIGS. 5A1 and 5A2 are a view illustrating an example of a section of a window waterproof structure according to an embodiment of the present disclosure. FIGS. 5B1, 5B2, 5B3, and 5B4 are a view illustrating various forms of a window waterproof structure according to an embodiment of the present disclosure.

Referring to FIG. 4, the window waterproof member 300 of the present disclosure may include an inner core 310, an outer sheath 320 (or outer part) surrounding at least a portion of the inner core 310.

The inner core 310 may be formed of a material (e.g., metal or plastic) having a specific hardness. At least a portion of an outer side of the inner core 310 may be surrounded by the outer sheath 320. The inner core 310 may function to support the outer sheath 320 having an elasticity while the outer sheath 320 shows elasticity between the external protective member 131 and the peripheral part 115 of the upper housing 110. The inner core 310 may restrain twisting and torsion that may occur in a process of assembling the window waterproof member 300 between the external protective member 131 and the upper housing 110 due to the flexibility of the outer sheath 320, and may function to support an aperture firmly.

According to an embodiment, as illustrated, the inner core 310 may have a circular band shape. An upper end 310x1 section of the inner core 310 may have a flat shape as a whole. A lower end 310x2 section of the inner core 310 may have a shape, a width of which gradually decreases. According to an embodiment, at least one protrusion that partially protrudes may be disposed at a lower end 310x2 of the inner core 310. The protrusion formed at a lower end 310x2 of the inner core 310 may have various shapes. Further, the lower end 310x2 of the inner core 310 may not have a separate protrusion but may have a flat shape.

Referring to FIGS. 5A1 and 5A2, the outer sheath 320 may surround an outer side of the inner core 310. Then, as in FIG. 5A1, the outer sheath 320 is not formed on an upper end 310x1 surface of the inner core 310 and may be formed a side and a lower end 310x2 of the inner core 310. FIG. 5A1 illustrates section 5A1 of an area in which a protrusion is not formed. According to an embodiment, as in FIG. 5A2, the outer sheath 320 may be formed at a lower end 310x2 of the inner core 310 but may be formed partially. Further, the outer sheath 320 may not be formed in a partially protruding portion of the lower end 310x2 of the inner core 310 but may be formed at a peripheral part of the protruding portion. FIG. 5A2 illustrates section 5A2 of an area in which a protrusion is formed.

The outer sheath 320 may be formed of a material (e.g., silicon or rubber) having a specific elasticity. According to an embodiment, when the outer sheath 320 does not have a separate protrusion at the lower end 310x2 of the inner core 310, it may surround the side wall and the lower end 310x2 of the inner core 310. Further, the outer sheath 320 may have a shape corresponding to the shape of the inner core 310 while at least one of the side wall and the lower end 310x2 of the inner core 310. For example, the outer sheath 320 may have a circular band-shaped furrow in which the inner core 310 is disposed. Further, the outer sheath 320 may have a shape, a width of which gradually decreases from an upper end toward a lower end thereof. According to an embodiment, an outer peripheral surface of the outer sheath 320 may have a shape, at least a portion of which is curved from an upper end to a lower end thereof, and an inner peripheral surface of the outer sheath 320 may have a constant shape at an upper end and a lower end thereof. Further, the inner peripheral surface of the outer sheath 320 may correspond to an edge shape of the external protective member, and the outer peripheral surface of the outer sheath 320 may correspond to an inner shape of the peripheral part 115 of the lower housing 120.

As described above, the electronic device 10 according to an embodiment of the present disclosure may firmly seal an aperture between the external protective member 131 and the upper housing 110 even though a pressure of a specific value or more is applied from a front side of the external protective member 131 to an inside of the housing 101 as the window waterproof member 300 including the inner core 310 having a specific thickness and the outer sheath 320 surrounding the inner core 310 is disposed. Accordingly, the electronic device 10 of the present disclosure may support a waterproof function of a specific pressure or more (e.g., not less than 3 atm).

Referring to FIG. 5B1, the electronic device according to an embodiment of the present disclosure may include a first window waterproof member 300a having a first inner core 310a an upper end 310a1 of which is flat and opposite lower edges of which are rounded and a first outer sheath 320a surrounding the first inner core 310a. The first outer sheath 320a surrounds a side wall and a lower end 310a2 of the first inner core 310a, except for an upper end 310a1 of the first inner core 310a, and a curvature of a left lower end of the first outer sheath 320a with respect to the drawing may be lower than a curvature of a right lower end of the first outer sheath 320a. Accordingly, the left lower end of the first inner core 310a and the left lower end of the first outer sheath 320a may have elliptical shapes.

Referring to FIG. 5B2, the electronic device according to an embodiment of the present disclosure may include a second inner core 310b and a second window waterproof member 300b. An upper end 310b1 of the second inner core 310b may be flat, and a curvature of a right lower end of the opposite lower edges of the second inner core 310b may be lower than a curvature of a left lower end thereof. The second window waterproof member 320b may include a second inner core 310b, and a second outer sheath 320b surrounding the second inner core 310b. The second outer sheath 320b surrounds a side wall and a lower end 310b2 of the second inner core 310b, except for an upper end 310b1 of the second inner core 310a, and a curvature of a right lower end of the second outer sheath 320b with respect to the front side of the drawing may be lower than a curvature of a left lower end of the second outer sheath 320b. For example, the curvature of the left lower end of the first inner core 310a and the curvature of the left lower end of the second outer sheath 320b may be similar (e.g., a semi-circular shape). Similarly, the curvature of the right lower end of the second inner core 310b and the curvature of the right lower end of the second outer sheath 320b may be similar (e.g., an elliptical shape).

Referring to FIG. 5B3, the electronic device according to an embodiment of the present disclosure may include a third inner core 310c and a third window waterproof member 300c. An upper end 310c1 of the third inner core 310c may be flat, and opposite lower edges of the third inner core 310c may be angled. The third window waterproof member 300c may include a third outer sheath 320c surrounding the third inner core 310c. The third outer sheath 320c may surround a side wall and a lower end 310c2 of the third inner core 310c except for an upper end 310c1 thereof, and may have a shape that is similar to that of the third inner core 310c (e.g., opposite lower peripheries of the third outer sheath 320c are angled and the center of the third outer sheath 320c is flat).

Referring to FIG. 5B4, the electronic device according to an embodiment of the present disclosure may include a fourth inner core 310d and a fourth window waterproof member 300d. An upper end and a lower end of the fourth inner core 310d may be flat and side walls of the fourth inner core 310d may be formed in parallel to each other such that the fourth inner core 310d may form a polygonal shape (e.g., a tetragonal shape). The fourth window waterproof member 300d may include a fourth outer sheath 320d surrounding the fourth inner core 310d. The fourth outer sheath 320d may be formed in opposite side walls of the fourth inner core 310d, and an upper end and a lower end of the fourth inner core 310d may be exposed. In addition to the abovementioned embodiments, the electronic device according to the embodiment of the present disclosure may include an inner core and an outer sheath in various forms.

Figure 6A:
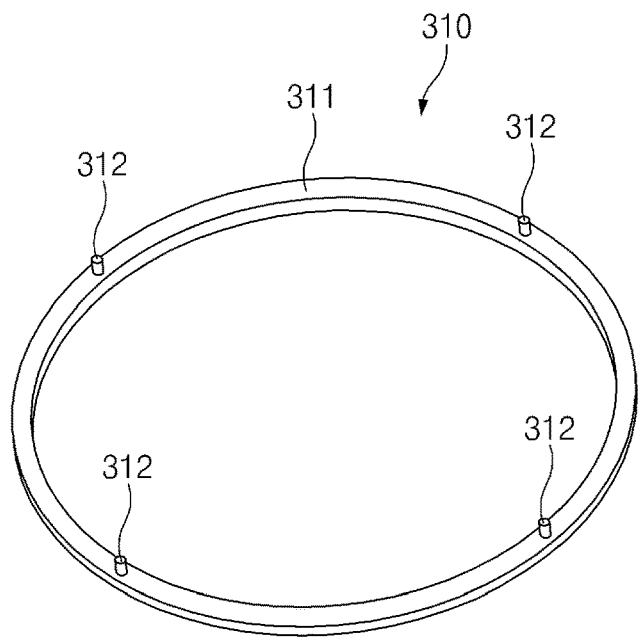
FIGS. 6A and 6B are a view illustrating an example of an inner core of a window waterproof structure according to an embodiment of the present disclosure.
Figure 6B:
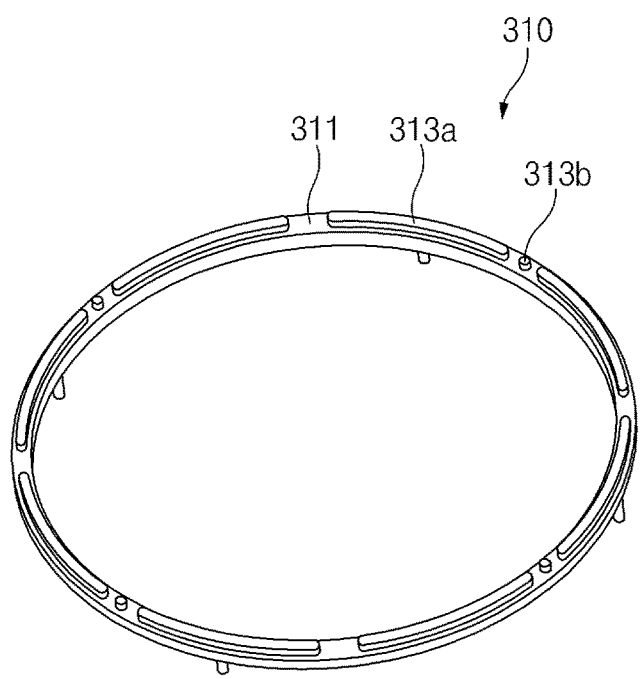

FIGS. 6A and 6B are a view illustrating an example of an inner core of a window waterproof structure according to an embodiment of the present disclosure.

Referring to FIGS. 6A and 6B, as illustrated, the inner core 310 for molding may include a ring 311 having a circular band shape and an upper end of which is flat, at least one fixing bosses 312 provided on one side of an upper end of the ring 311, and at least one protrusion 313a and 313b formed at a lower end of the ring 311.

Referring to FIG. 6A, an upper end of the ring 311 may be flat and the fixing boss 312 may be disposed at least one portion of the flat upper end surface of the ring 311. According to an embodiment, a plurality of fixing bosses 312 may be disposed, and may be symmetrically disposed at an upper end of the ring 311. Although it is illustrated in the drawing that four fixing bosses 312 are disposed, the present disclosure is not limited thereto. For example, the number of the fixing bosses 312 may be various, and may be two, three, five, or six. According to various embodiments, the fixing bosses 312 may have various shapes (e.g., polygonal columns such as a triangular column and a rectangular column) in addition to a cylindrical shape. According to various embodiments, in relation to the shape of the inner core 310, a mold having a hole corresponding to the fixing boss 312 may be provided, and an injection-molding material (e.g., a plastic injection-molding material) having a specific strength may be injected into the mold through a hole corresponding to the fixing boss 312.

Referring to FIG. 6B, the protrusion 313a and 313b disposed at a lower end of the ring 311 may include rail bosses 313a protruding while having a specific height form a surface thereof and a specific length, and intermediate bosses 313b disposed between the rail bosses 313a. The rail bosses 313a and the intermediate bosses 313b, which have been described above, may function to firmly fix the inner core 310 in a process of forming the outer sheath 320 based on the inner core 310. According to various embodiments, the rail bosses 313a and the intermediate bosses 313b may function to stably support the outer sheath 320 after the window waterproof member 300 is finished while guiding the injection-molding material such that the injection-molding material is uniformly spread out in the interior of the mold in a process of inserting (or injecting or introducing) the injection-molding material for forming the outer sheath 320 into the mold. According to an embodiment, while an area disposed on an outer peripheral surface of the outer sheath 320 is attached to a side wall of the external protective member 131, the rail bosses 313a may improve a sealing force while supporting an outer peripheral surface of the outer sheath 320 more firmly.

Figure 7:
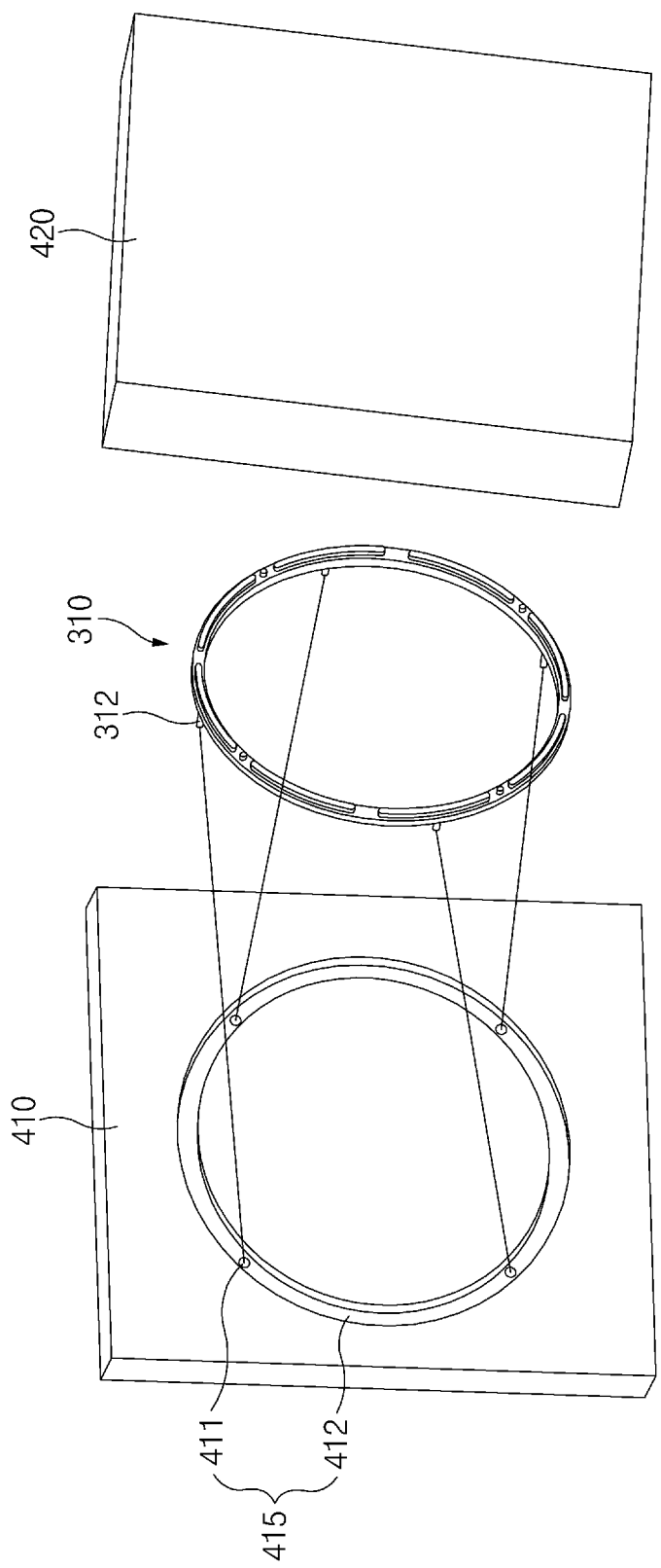
FIG. 7 is a view illustrating an example of an inner core and a mold that are separated from each other according to an embodiment of the present disclosure.
Figure 8:
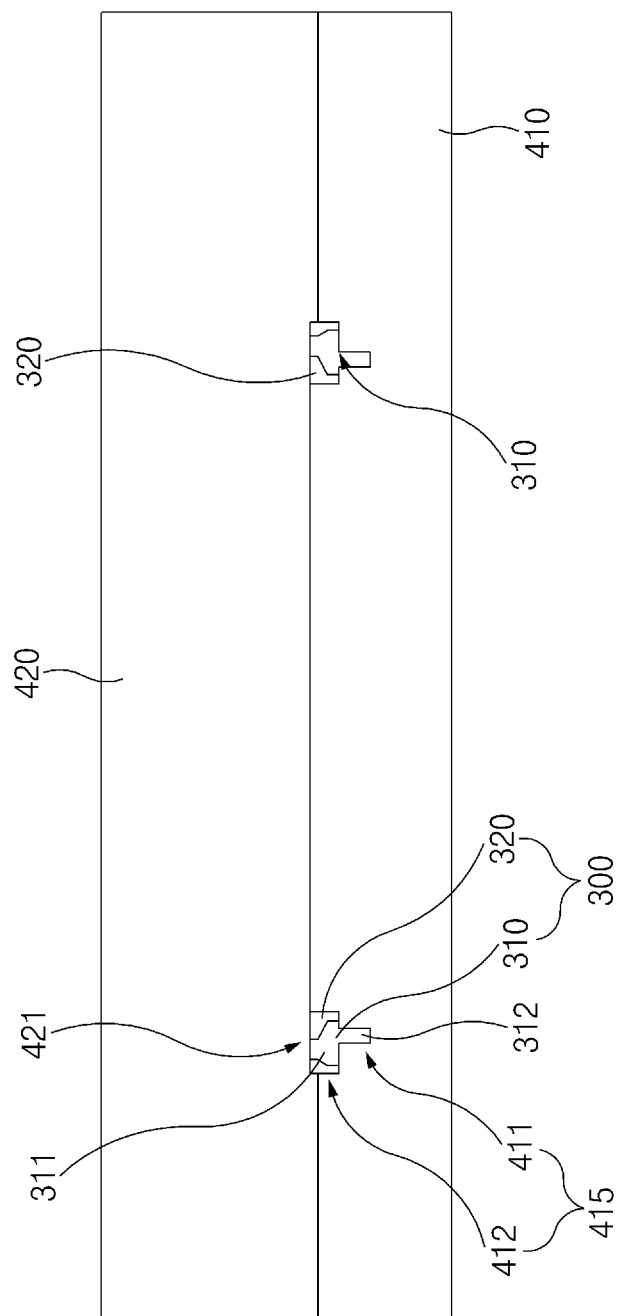
FIG. 8 is a view illustrating an example of an inner core and a mold that are coupled to each other according to an embodiment of the present disclosure.

FIG. 7 is a view illustrating an example of an inner core and a mold that are separated from each other according to an embodiment of the present disclosure. FIG. 8 is a view illustrating an example of an inner core and a mold that are coupled to each other according to an embodiment of the present disclosure.

Referring to FIGS. 7 and 8, as illustrated in FIG. 7, in relation to formation of the window waterproof member 300, a fixing mold 410 having a core groove 415 corresponding to an upper end 310x1 of the inner core 310 may be provided. The core groove 415, for example, may include fixing grooves 411 into which the fixing bosses 312 of the inner core 310, which has been described in state 601 of FIG. 6, is inserted to be fixed, and a ring groove 412 corresponding to the ring 311. The depth of the fixing grooves 411 may correspond to the height of the fixing bosses 312. The size of the ring grooves 412 may be similar to the shape of the ring 311 and may be larger than the size of the ring 311. An upper end surface of the ring 311 may face and contact the bottom surface of the ring groove 412 while the outer sheath 320 is formed.

A pair of movable molds 420 disposed in a fixed mold 410 may have a rail groove 421 corresponding to a lower end of the inner core 310. The rail groove 421 may correspond to at least one rail boss 313a formed at a lower end of the inner core 310. Further, the rail groove 421 may include a groove provided in the intermediate boss 313b provided in the inner core 310. The bottom surfaces of the rail bosses 313a and the intermediate bosses 313b may contact the bottom surface of the rail groove 421 while the outer sheath 320 is formed.

If the fixing bosses 312 is inserted into the core grooves 415 of the fixing mold 410, an upper end of the ring 311 may be positioned at the center of the ring groove 412, and accordingly, a space may be formed between the side wall of the ring 311 and the ring groove 412. If the movable mold 420 having a rail groove 421 that is larger than the rail bosses 313a and the intermediate bosses 313b is disposed to contact one surface of the fixed mold 410, a space may be formed between the rail bosses 313a and the rail groove 421. As an insert-molding material (e.g., silicon) is injected into the ring groove 412 and the rail groove 421 while the fixed mold 410 and the movable mold 420 are fixed to each other while contacting each other, the outer sheath 320 may be formed at at least a portion of the inner core 310.

Figure 9:
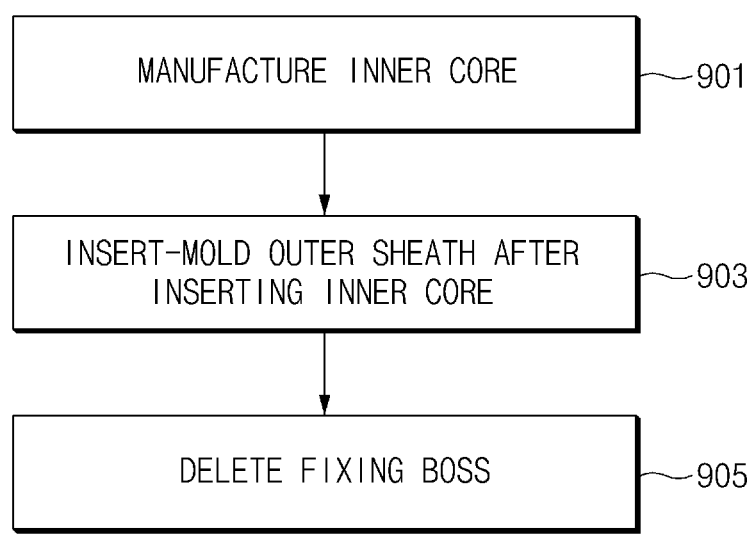
FIG. 9 is a view illustrating an example of a method for manufacturing a window waterproof structure according to an embodiment of the present disclosure.
Figure 10:
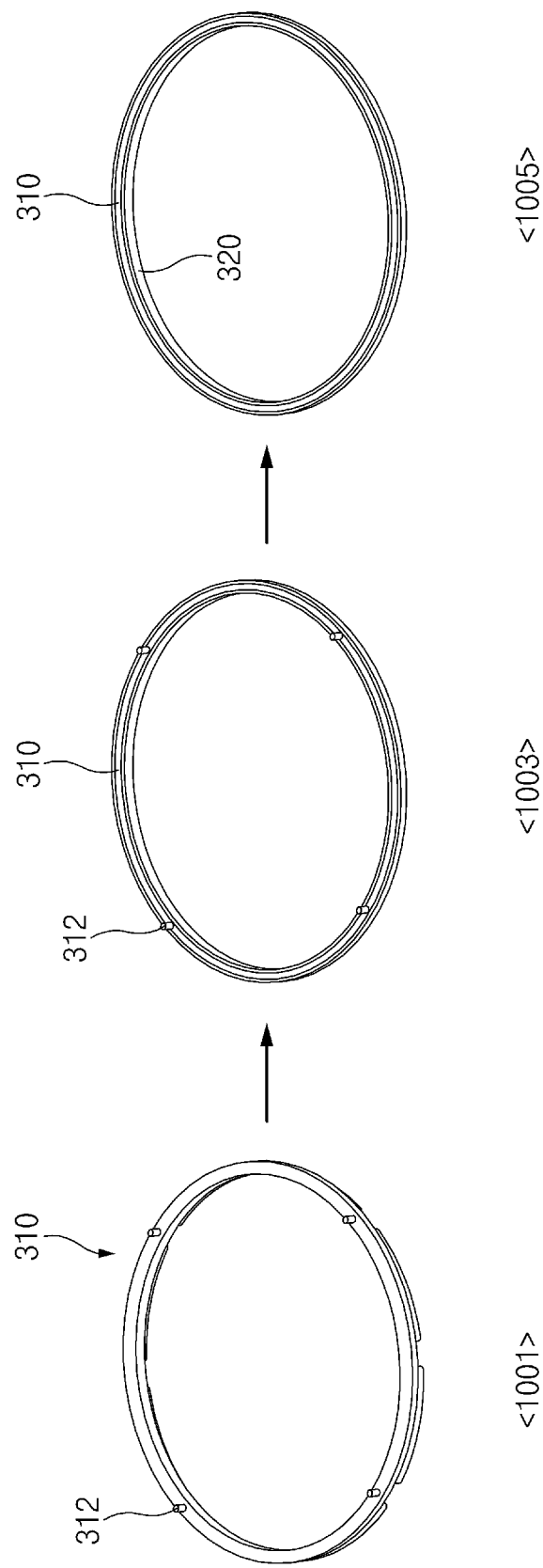
FIG. 10 is a view illustrating an example of machining of a window waterproof structure according to an embodiment of the present disclosure.

FIG. 9 is a view illustrating an example of a method for manufacturing a window waterproof structure according to an embodiment of the present disclosure. FIG. 10 is a view illustrating an example of machining of a window waterproof structure according to an embodiment of the present disclosure;

Referring to FIGS. 9 and 10, in relation to the method for manufacturing a window waterproof member, in operation 901, the inner core 310 as in state 1001 may be manufactured. When the inner core 310 is manufactured, a fixing boss 312 may be formed to adjust left and right eccentricity of the inner core 310. A plurality of fixing bosses 312 may be disposed on the ring-shaped inner core 310 to be symmetrical to each other. Two or more fixing bosses 312, for example, may be provided.

In operation 903, the outer sheath 320 may be injection-molded after the inner core 310 is insert-molded. The fixing boss 312 provided in the inner core 310 may be inserted into the fixing groove 411 provided in the fixed mold 410. When the side wall of the inner core 310 is to be fixed, because the outer sheath 320 (e.g., silicon) is not formed in the side wall, the inner core 310 may be fixed to the fixed mold 410 by using the fixing boss 312. In a situation in which the fixed mold 410 and the movable mold 420 are firmly fixed, a space, into which an injection-molding material, of which the outer sheath 320 is to be formed, is to be introduced, may be formed between the fixed mold 410 and the movable mold 420 while the fixing boss 312 of the inner core 310 is fixed to the fixed mold 410 and the bottom surfaces of the rail bosses 313a and the intermediate bosses 313b of the inner core 310 are fixed to the movable mold 420. The inner core 310 may be prevented from being damaged and work efficiency may be improved during an insert-molding process while an upper end 310x1 of the inner core 310 firmly contacts the fixed mold 410.

In operation 905, the fixing bosses 312 of the inner core 310 may be cut away. As in state 1003, the used fixing bosses 313 during an injection-molding process may be left at an upper end 310x1 of the inner core 310 of the widow waterproof member 300 having the outer sheath 320. Accordingly, as in state 1005, the upper end 310x1 of the inner core 310 may be formed flat by removing the fixing bosses 312.

If the window waterproof member 300 that has been finished based on the above-mentioned process is provided, damage of the window waterproof member 300 may be improved by disposing an upper end surface of the window waterproof member 300, in which the outer sheath 320 is not formed, towards the outside of the electronic device 10 (e.g., from the center of the housing 101 toward the opened area) and disposing an upper end of the window waterproof member 300 having a strength that is higher than that of the other parts on an upper side of a point between the external protective member 131 and the housing 101.

Figure 11A:
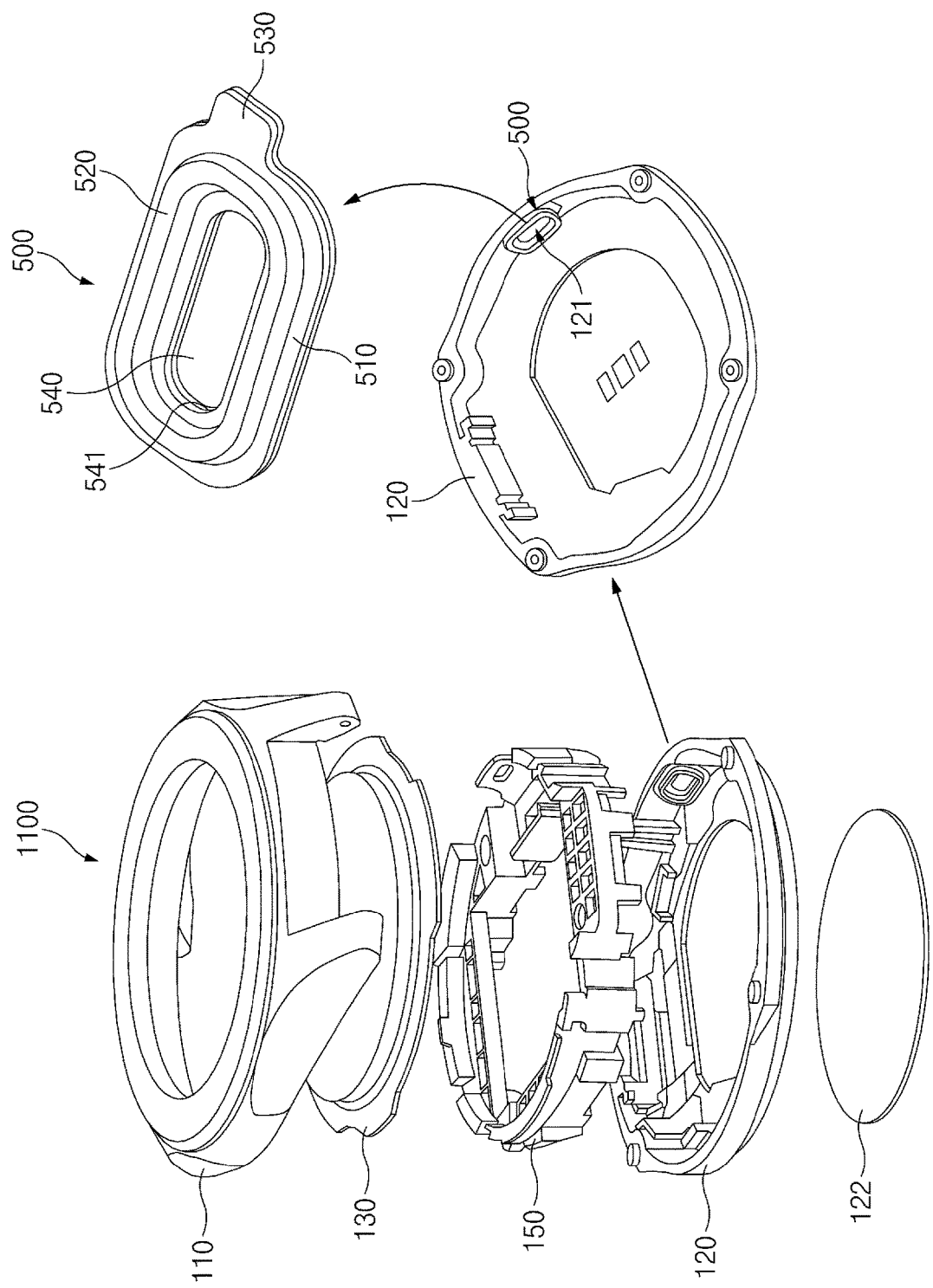
FIG. 11A is a view illustrating an example of an electronic device including a speaker waterproof structure according to an embodiment of the present disclosure.
Figure 11B:
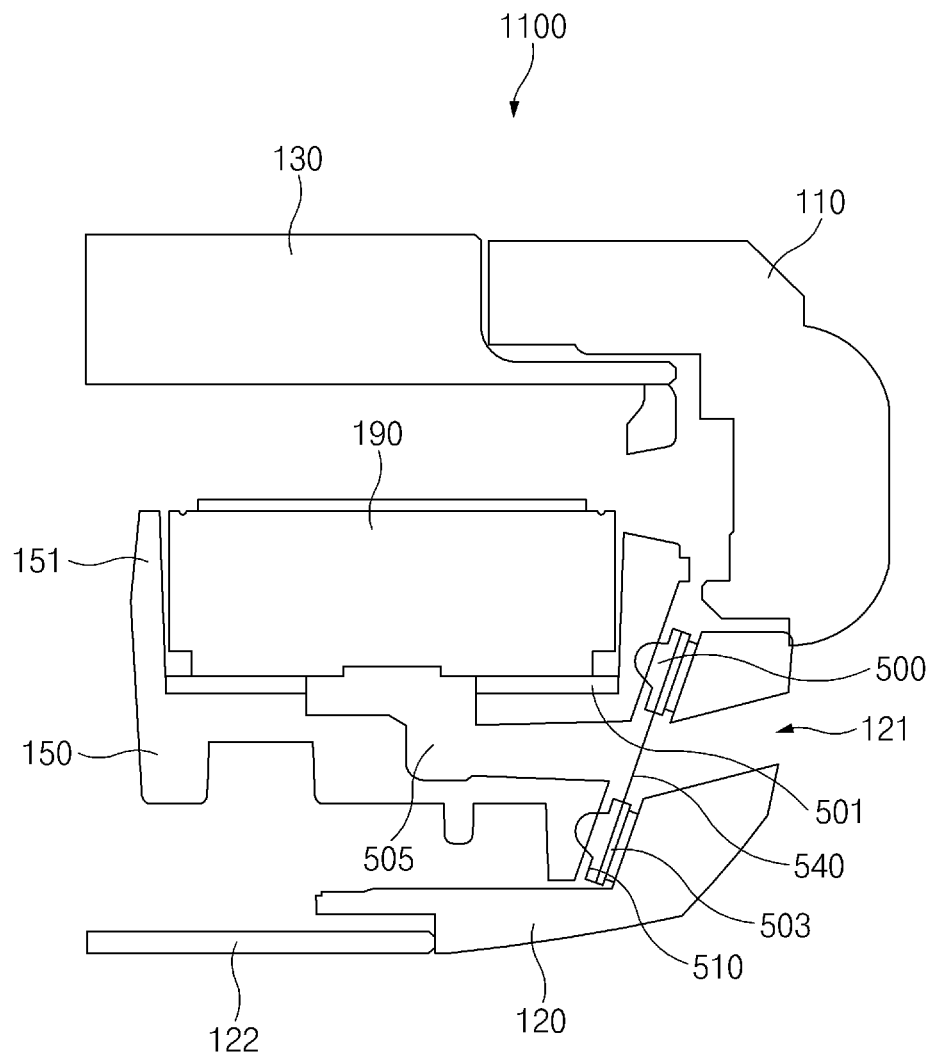
FIG. 11B is a view illustrating an example of a section of an area in which a speaker waterproof structure of an electronic device is disposed, according to an embodiment of the present disclosure.

FIG. 11A is a view illustrating an example of an electronic device including a speaker waterproof structure according to an embodiment of the present disclosure. FIG. 11B is a view illustrating an example of a section of an area in which a speaker waterproof structure of an electronic device is disposed, according to an embodiment of the present disclosure.

Referring to FIGS. 11A and 11B, the electronic device 1100 according to an embodiment of the present disclosure may include an upper housing 110, a lower housing 120, a display 130, a bracket 150, and a rear case 122, and a speaker waterproof member 500 may be disposed on one side of the lower housing 120.

As illustrated, the lower housing 120, for example, may include a bottom part that is convex downwards and having an empty interior, and a side wall extending at an edge of the bottom part to be perpendicular to the bottom part (or while having a specific inclination). A speaker hole 121 configured to output an audio signal generated by the speaker 190 may be disposed in an area of the side wall of the lower housing 120. Although the drawing illustrates that an opened area is provided at the center of the bottom part of the lower housing 120 and the rear case is disposed to block the opened area, the present disclosure is not limited thereto. For example, the lower housing 120 and the rear case 122 may be integrally formed.

The bracket 150 may include a seating part 151 in which the speaker 190 is disposed, in a specific area. The seating part 151 may be provided to surround the speaker 190, and a speaker sound hole 505 may be formed in a side of the specific area, on which an audio signal is output from the speaker 190. A bonding member 501 may be disposed between the seating part 151 and one surface of the speaker 190 to fix the speaker 190 to the seating part 151 of the bracket 150. The bonding member 501 may be disposed between a peripheral part of the speaker 190 and the seating part 151 such that an audio output area of the speaker 190 and an inlet of the speaker sound hole 505 of the seating part 151 may be firmly maintained. According to various embodiments, the bonding member 501 may function to prevent an audio signal output from the speaker 190 from being leaked to peripheral areas while the audio signal is output toward the lower housing 120 through the speaker sound hole 505. The speaker sound hole 505 of the bracket 150 may be connected to the speaker hole 121 of the lower housing 120. Accordingly, the audio signal generated by the speaker 190 may be output to the outside through the speaker hole 121 of the lower housing 120 after propagating through the speaker sound hole 505 of the bracket 150.

The speaker waterproof member 500 may be disposed between a peripheral part of the speaker sound hole 505 of the bracket 150 and a peripheral part of the speaker hole 121 of the lower housing 120. As illustrated, the speaker waterproof member 500 may include a speaker waterproof support 510, a speaker waterproof boss 520, and a first fixing part 530. According to various embodiments, the speaker waterproof member 500 may further include a waterproof film 540 of a specific thickness such that the audio signal generated by the speaker 190 may be output to the outside while a hole provided at the center of the speaker waterproof support 510 is closed. According to various embodiments, the waterproof film 540 of a specific thickness may be disposed between the speaker 190 and the speaker sound hole 505 provided in the seating part 151. Further, the speaker waterproof member 500 may further include a bonding member 503 disposed on the rear surface of the speaker waterproof support 510 (e.g., a surface of the speaker waterproof support 510 facing the lower housing 120).

The speaker waterproof support 510, for example, may include an opened area 541 having a size that is larger than that of the speaker hole 121, and a band-shaped panel having an empty and flat center to form the opened area 541. The speaker waterproof boss 520 may be disposed on a front surface of the speaker waterproof support 510, and the bonding member 503 may be disposed on a rear surface of the speaker waterproof support 510. The speaker waterproof support 510 may be formed of the same material as that of the speaker waterproof boss 520. Further, the speaker waterproof support 510 may be formed of a plastic material or a metallic material having a specific strength. When the speaker waterproof support 510 is formed of silicon having a specific elasticity, the film (functioning as a stiffener) having a specific strength may be surrounded by silicon.

The speaker waterproof boss 520 may protrude from a front surface of the band-shaped speaker waterproof support 510 while having a specific height. The speaker waterproof boss 520 may uniformly protrude from the center of a panel of the speaker waterproof support 510 to have a band shape. The speaker waterproof boss 520 may be curved such that the center thereof is higher than the peripheral parts thereof. Accordingly, the speaker waterproof boss 520 may surface-contact one surface of the bracket 150 while at least a portion thereof is pressed in a process of assembling the lower housing 120 and the bracket 150.

The speaker waterproof boss 520, for example, may be formed of a material (e.g., silicon or rubber) having a specific elasticity. When the speaker waterproof support 510 is formed of plastic, the speaker waterproof boss 520 may be bonded to the speaker waterproof support 510 by a bonding member.

The first fixing part 530 may function to fix the speaker waterproof member 500 to one side of the lower housing 120. In this regard, a boss or a hook, into which the first fixing part 530 may be inserted, may be disposed on one side of the bracket 150.

In the electronic device 1100 according to the embodiment of the present disclosure, moisture may be prevented from being introduced through the speaker hole 121, by closing the speaker hole 121 provided on one side of the lower housing 120 with the speaker waterproof member 500.

Figure 12A:
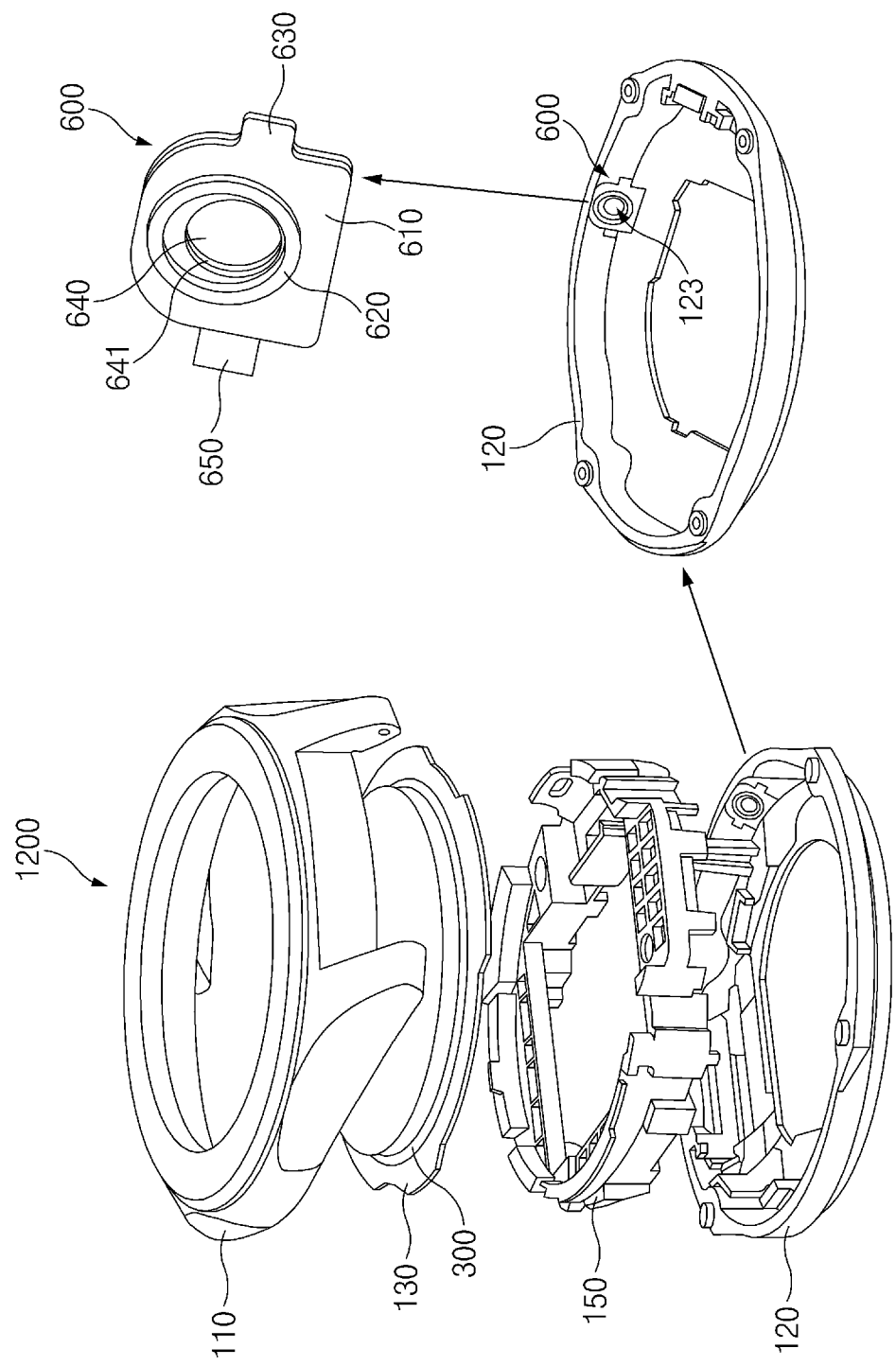
FIG. 12A is a view illustrating an example of an electronic device including a microphone waterproof structure according to an embodiment of the present disclosure.
Figure 12B:
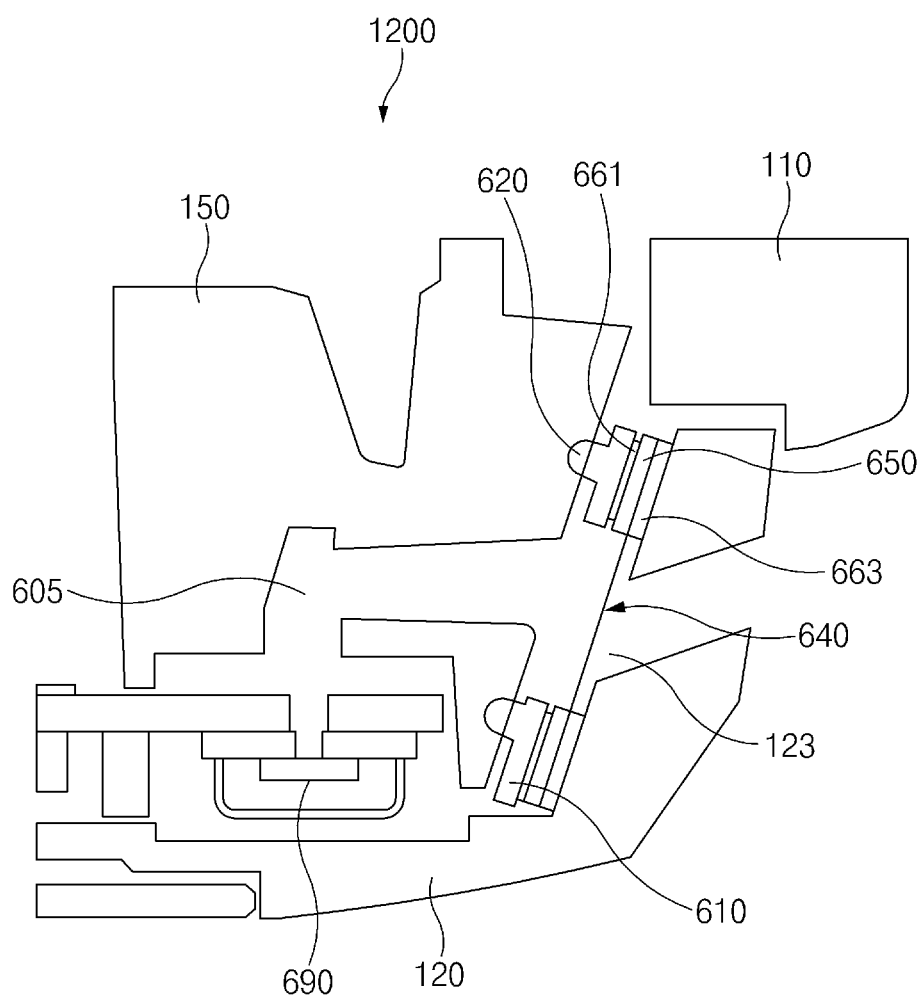
FIG. 12B is a view illustrating an example of a section of an area in which a microphone waterproof structure of an electronic device is disposed, according to an embodiment of the present disclosure.

FIG. 12A is a view illustrating an example of an electronic device including a microphone waterproof structure according to an embodiment of the present disclosure. FIG. 12B is a view illustrating an example of a section of an area in which a microphone waterproof structure of an electronic device is disposed, according to an embodiment of the present disclosure.

Referring to FIGS. 12A and 12B, the electronic device 1200 according to an embodiment of the present disclosure may include an upper housing 110, a lower housing 120, a display 130, a bracket 150, and a rear case 122, and a microphone waterproof member 600 may be disposed on one side of the lower housing 120. Further, the window waterproof member 300 may be disposed on one side of the display 130 (e.g., at a periphery of the external protective member).

The lower housing 120, for example, may include a bottom part that is convex downwards and has an empty interior, and a side wall disposed at a periphery of the bottom part. A microphone hole 121, through which an audio signal generated by the speaker 690 may be introduced, may be disposed in an area of the side wall of the lower housing 120. A microphone 690, for example, may be disposed on one side of the lower housing 120 or one side of the bracket.

An area related to the microphone 690 may be formed in a specific area of the bracket 150. For example, the bracket 150 may include a microphone sound hole 605 having the shape of a passage extending to the microphone hole 123. The microphone sound hole 605 may extend from a part that is adjacent to the microphone 690 to the microphone hole 123 formed in the bracket 150 and the lower housing 120. The audio signal introduced through the microphone hole 123 may be delivered to the microphone 690 through the microphone sound hole 605.

The microphone waterproof member 600 may be disposed between an end of the microphone sound hole 605 of the bracket 150 and a peripheral part of the microphone hole 123 of the lower housing 120. As illustrated, the microphone waterproof member 600 may include a microphone waterproof support 610, a microphone waterproof boss 620, a second fixing part 630, a membrane 640, and a wing 650. At least a portion of the wing 650 may be disposed on a side of the microphone waterproof support 610, and the microphone waterproof support 610 may be disposed to be supported by the side wall of the lower housing 120 more firmly.

The microphone waterproof support 610, for example, may include an opened area 641 having a size that is larger than that of the microphone hole 123, and a band-shaped panel having an empty and flat center to form the opened area 641. The microphone waterproof boss 620 may be disposed on a front surface of the microphone waterproof support 610, the membrane 640 may be disposed at the center of the microphone waterproof support 610, and the bonding member 661 and 663 and the stiffener film 650 may be disposed on the rear surface of the microphone waterproof support 610. The microphone waterproof support 610 may be formed of the same material as that of the microphone waterproof boss 620. The stiffener film 650 may function to support strength of the microphone waterproof support 610.

The microphone waterproof boss 620 may protrude from a front surface of the band-shaped microphone waterproof support 610 while having a specific height. The microphone waterproof boss 620 may be provided in a convex form in which the height of the microphone waterproof boss 620 gradually increases from a periphery to the center thereof. Accordingly, the microphone waterproof boss 620 may surface-contact one surface of the bracket 150 while a portion thereof being pressured, when the bracket 150 and the lower housing 120 are coupled to each other. The microphone waterproof boss 620, for example, may be formed of a material (e.g., silicon or rubber) having a specific elasticity.

At least a portion of the second fixing part 630 may function to fix the microphone waterproof member 600 to one side of the lower housing 120. In this regard, a boss or a hook, into which the second fixing part 630 may be inserted, may be disposed on one side of the bracket 150.

The membrane 640 may introduce an external audio signal into the microphone sound hole 605 while closing the opened area 641 of the center of the microphone waterproof support 610. The membrane 640 may send moisture existing in the interior of the microphone water proof support 610 (e.g., the microphone sound hole 605) while preventing moisture from being introduced from the outside to the inside. In this regard, the membrane 640 may be formed such that a plurality of porous layers overlap each other, and the plurality of porous layers may be arranged in a specific pattern while the sizes of the pores of the plurality of layer are formed differently.

In the electronic device 1200 according to the embodiment of the present disclosure, moisture may be prevented from being introduced through the microphone hole 123, by sealing an aperture between the bracket and the lower housing with the microphone waterproof member 600 and closing the microphone hole 123 provided on one side of the lower housing 120 with the speaker waterproof member 600.

Figure 13A:
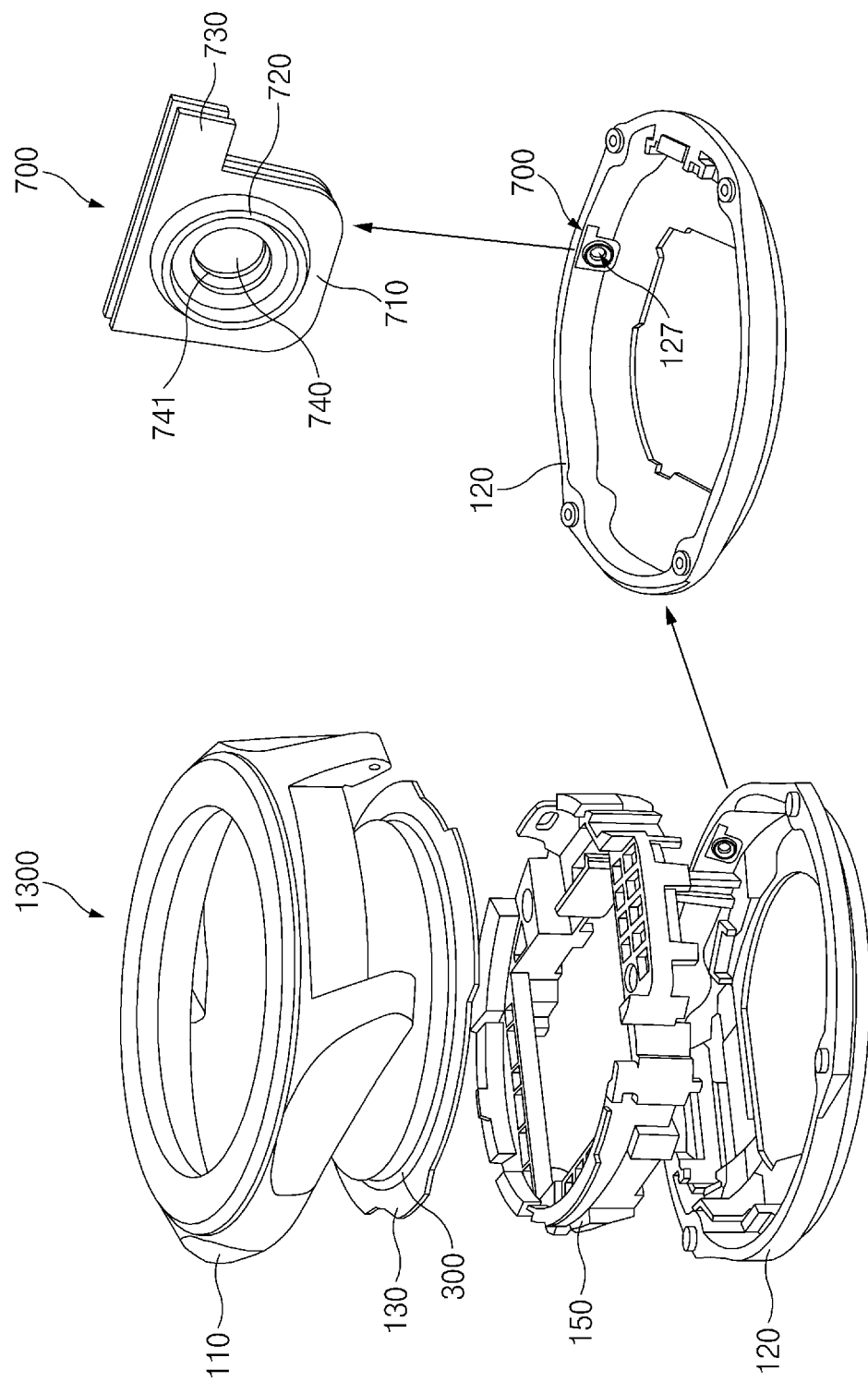
FIG. 13A is a view illustrating an example of an electronic device including an air vent waterproof structure according to an embodiment of the present disclosure.
Figure 13B:
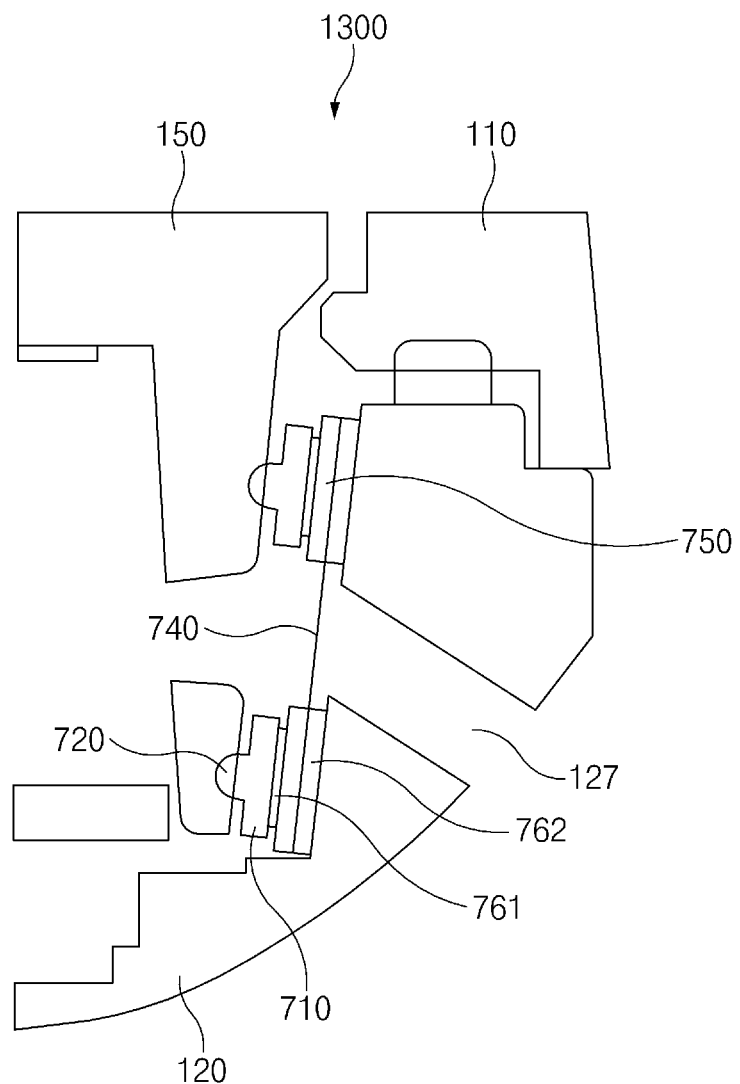
FIG. 13B is a view illustrating an example of a section of an area in which an air vent waterproof structure of an electronic device is disposed, according to an embodiment of the present disclosure.

FIG. 13A is a view illustrating an example of an electronic device including an air vent waterproof structure according to an embodiment of the present disclosure. FIG. 13B is a view illustrating an example of a section of an area in which an air vent waterproof structure of an electronic device is disposed, according to an embodiment of the present disclosure.

Referring to FIGS. 13A and 13B, the electronic device 1300 according to an embodiment of the present disclosure may include an upper housing 110, a lower housing 120, a display 130, a bracket 150, and a rear case 122, and an air vent waterproof member 700 may be disposed on one side of the lower housing 120. Further, the window waterproof member 300 may be disposed on one side of the display 130 (e.g., at a periphery of the external protective member). The electronic device 1300 may include an air vent hole 127 that maintains a difference between the atmospheric pressures of the outside and the inside of the device. For example, the air vent hole 127 also may lower an internal pressure while discharging the interior air to the outside.

The lower housing 120, for example, may include a bottom part, and a side wall disposed at a periphery of the bottom part. An air vent hole 127 related to adjustment of the atmospheric pressure difference of the electronic device 10 may be disposed in an area of the side wall of the lower housing 120.

The bracket 150 may include an empty space in which the air vent hole 127 is arranged, in a specific area thereof. An air vent waterproof member 700 may be disposed between the side walls forming the empty space of the bracket 150 and a peripheral part forming the air vent hole 127.

As illustrated, the air vent waterproof member 700 may include an air vent waterproof support 710, an air vent waterproof boss 720, a third fixing part 730, and a membrane 740.

The air vent waterproof support 710, for example, may include an opened area 741 having a size that is larger than that of the air vent hole 127, and a band-shaped panel having an empty and flat center to form the opened area 741. The air vent waterproof boss 720 may be disposed on a front surface of the air vent waterproof support 710, the membrane 740 may be disposed at the center of the air vent waterproof support 710, and the bonding member 761 and 762 and the stiffener film 750 may be disposed on the rear surface of the air vent waterproof support 710. The air vent waterproof support 710 may be formed of the same material as that of the air vent waterproof boss 720. The stiffener film 650 may function to support the strength of the air vent waterproof support 710.

The air vent waterproof 720 may protrude from a front surface of the band-shaped air vent waterproof support 710 while having a specific height. The air vent waterproof boss 720 may be provided in a convex form in which the height of the air vent waterproof boss 720 gradually increases from a periphery to the center thereof. For example, the air vent waterproof boss 720 may have a band shape, a cross-section of which is semi-circular. When the bracket 150 and the lower housing 120 are coupled to each other, the air vent water proof boss 720 may seal an aperture between the bracket 150 and the lower housing 120 while contacting the side walls forming the empty space of the bracket 150. The air vent waterproof boss 720, for example, may be formed of a material (e.g., silicon or rubber) having a specific elasticity.

The third fixing part 730 may function to fix the air vent waterproof member 700 to one side of the lower housing 120. In this regard, a boss or a hook, into which the third fixing part 730 may be inserted, may be disposed on one side of the bracket 150.

The membrane 740, for example, may have a material and a function that are the same as or similar to those of the waterproof film 540 included in the speaker waterproof member 500, which has been described above, or the membrane included in the microphone waterproof member 600. For example, the membrane 740 may prevent moisture from being introduced from the outside while discharging moisture inside the device with respect to the air vent hole 127 to the outside of the lower housing 120.

In the electronic device 1300 according to the embodiment of the present disclosure, moisture may be prevented from being introduced through the air vent hole 127, by closing the air vent hole 127 provided on one side of the lower housing 120 with the air vent waterproof member 700.

Figure 14A:
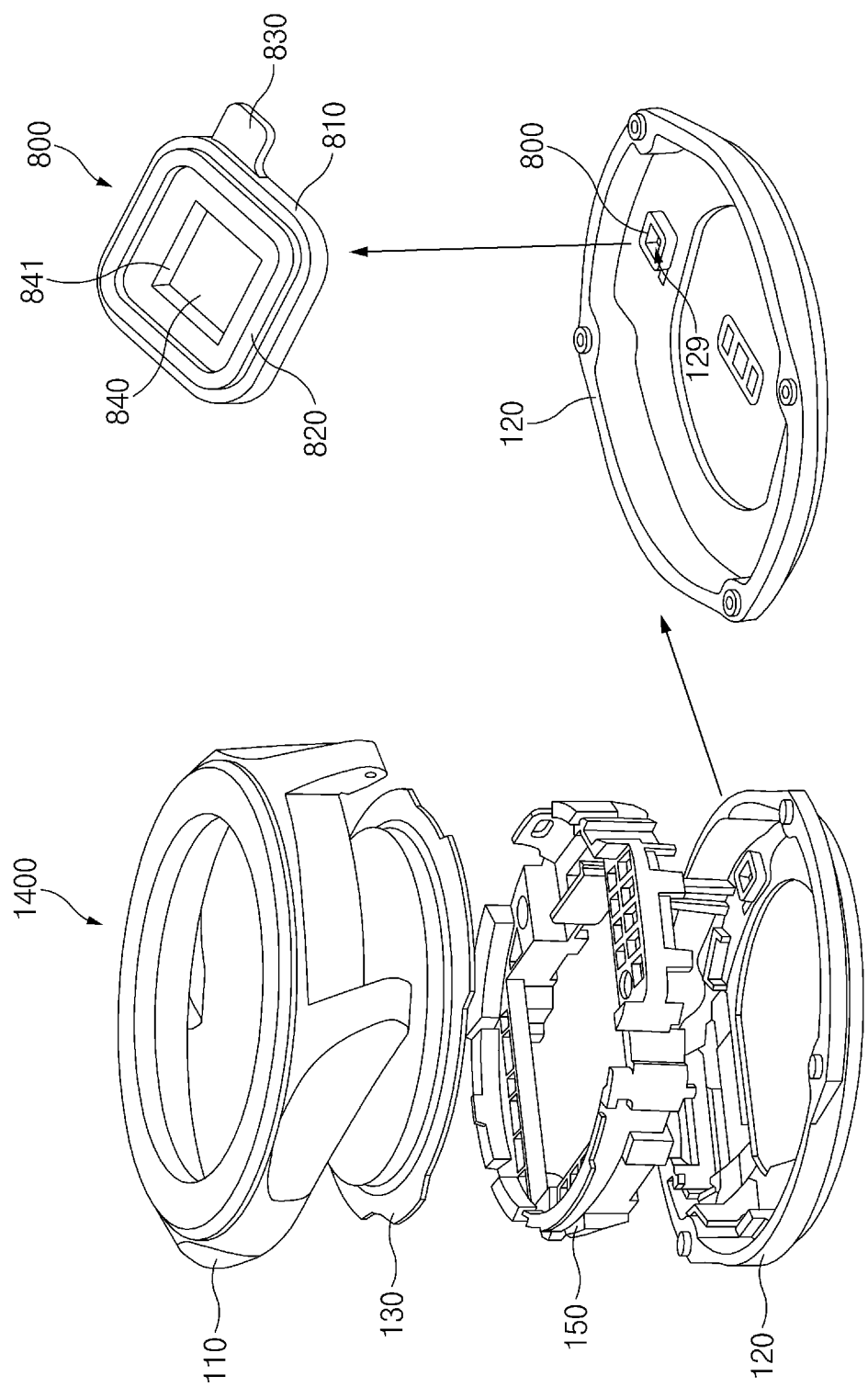
FIG. 14A is a view illustrating an example of an electronic device including a sensor waterproof structure according to an embodiment of the present disclosure.
Figure 14B:
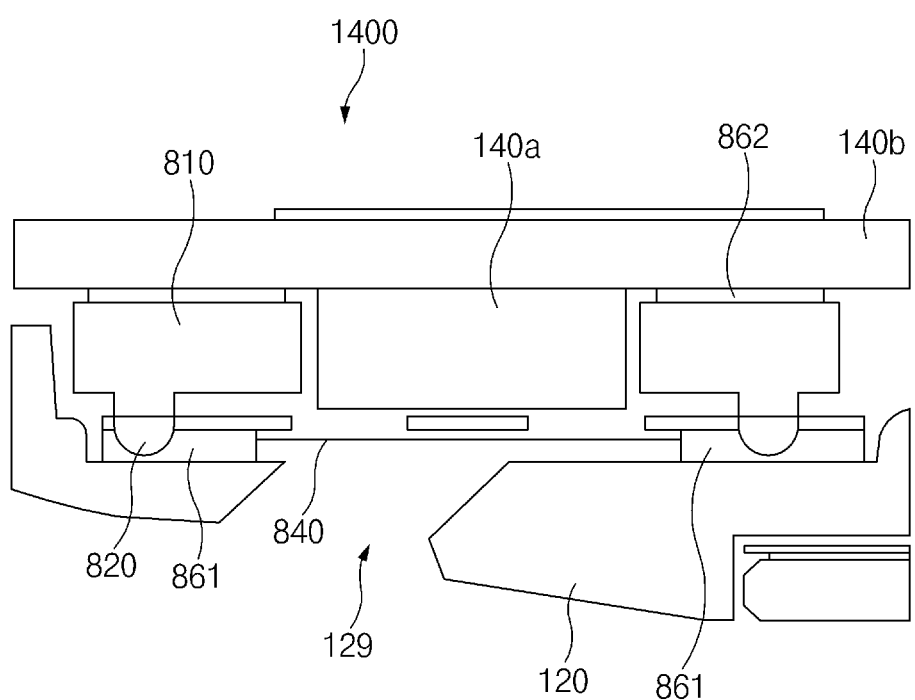
FIG. 14B is a view illustrating an example of a section of an area in which a sensor waterproof structure of an electronic device is disposed, according to an embodiment of the present disclosure.

FIG. 14A is a view illustrating an example of an electronic device including a sensor waterproof structure according to an embodiment of the present disclosure. FIG. 14B is a view illustrating an example of a section of an area in which a sensor waterproof structure of an electronic device is disposed, according to an embodiment of the present disclosure.

Referring to FIGS. 14A and 14B, the electronic device 1400 according to an embodiment of the present disclosure may include an upper housing 110, a lower housing 120, a display 130, a bracket 150, and a rear case 122, and a sensor waterproof member 800 may be disposed on one side of the lower housing 120. Further, the window waterproof member may be further disposed on one side of the display 130 (e.g., at least a portion of a periphery of the external protective member).

As mentioned above, the lower housing 120, for example, may include a bottom part, and a side wall disposed at a periphery of the bottom part. A second air vent hole 129 related to sensing of atmospheric pressure may be disposed in an area of the bottom part of the lower housing 120.

An atmospheric pressure sensor 140*a* aligned with the second sensor hole 129 and a substrate 140*b*, on which the atmospheric pressure sensor 140*a* is mounted, may be seated in and fixed to a specific area of the bracket 150. A sensor waterproof member 800 may be disposed to surround the atmospheric pressure sensor 140*a* disposed on the substrate 140*b*. The electronic device 1400 may further include a bonding member 862 for bonding the sensor waterproof member 800 to the substrate 140*b*.

As illustrated, the sensor waterproof member 800 may include a sensor waterproof support 810, a sensor waterproof boss 820, a fourth fixing part 830, and a membrane 840.

The sensor waterproof support 810, for example, may include an opened area 841 having a size that is larger than that of the second sensor hole 129, and a band-shaped panel having an empty and flat center to form the opened area 841. An atmospheric pressure 140*a* may be disposed in the opened area 841 of the sensor waterproof support 810. The sensor waterproof boss 820 may be disposed on a front surface of the sensor waterproof support 810, the membrane 841 may be disposed at an upper end of the opened area 841 of the sensor waterproof support 810, and the bonding member 862 may be disposed on the rear surface of the sensor waterproof support 810. According to various embodiments, at least a portion of the sensor waterproof support 810 may include a stiffener film to have a specific strength.

The sensor waterproof 820 may protrude from a front surface of the band-shaped sensor waterproof support 810 while having a specific height and having a semicircular convex cross-section. The sensor waterproof boss 820 may seal an aperture between a peripheral part of the atmospheric pressure sensor 140*a* and the lower housing 120 while contacting one side of the lower housing 120. The sensor waterproof boss 820, for example, may be formed of a material (e.g., silicon or rubber) having a specific elasticity.

According to various embodiments, the bonding member 861 may be disposed on the sensor waterproof boss 820, and the bonding member 861 may be bonded to a periphery of the second sensor hole 129 of the lower housing 120. The bonding member 861 may have a band shape according to the shape of the sensor waterproof support 810, and a membrane 840 may be disposed to interrupt the opened area of the center of the bonding member 861. Accordingly, while the bonding member 861 is bonded to the lower housing 120, the membrane 840 may close the second sensor hole 129.

The fourth fixing part 830 may function to fix the sensor waterproof member 800 to one side of the lower housing 120. In this regard, a boss or a hook, into which the fourth fixing part 830 may be inserted, may be disposed on one side of the bracket 150.

In the electronic device 1400 according to the embodiment of the present disclosure, moisture may be prevented from being introduced through the second sensor hole 129, by closing the second sensor hole 129 provided on one side of the lower housing 120 with the sensor waterproof member 800.

The speaker waterproof member 500, the microphone waterproof member 600, the air vent waterproof member 700, and the sensor waterproof member 800 may provide a waterproof environment of a specific level or more (e.g., 3 atm or more) by firmly sealing the bracket 150 and the lower housing 120 by using a boss while closing various holes of the electronic device 1400. The electronic device according to an embodiment of the present disclosure may include at least one of the waterproof members, which have been described above. For example, the electronic device may include at least one of the window waterproof member 300, the speaker waterproof member 500, the microphone waterproof member 600, the air vent waterproof member 700, and the sensor waterproof member 800.

Embodiments of the present disclosure described and shown in the drawings are provided as examples to describe technical content and help understanding but do not limit the present disclosure. Accordingly, it should be interpreted that besides the embodiments listed herein, all modifications or modified forms derived based on the technical ideas of the present disclosure are included in the present disclosure as defined in the claims, and their equivalents.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

The control unit may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. In addition, an artisan understands and appreciates that a "processor" or "microprocessor" may be hardware in the claimed disclosure.

As, stated above, according to various embodiments, an electronic device is provided. The electronic device may include a display, an upper housing disposed at least a portion of a periphery of the display, a lower housing couple-d to the upper housing and a window waterproof member disposed between at least a portion of a periphery of the display and the upper housing and sealing an aperture between the upper housing and the display, wherein the window waterproof member may include an inner core having a specific strength and an outer sheath having a specific elasticity, and an outer peripheral surface of which contacts at least part of the upper housing and an inner peripheral surface of which contacts at least part of the display while the outer sheath surrounding at least a portion of the inner core.

According to various embodiments, an upper end of the inner core may be thicker than a lower end of the inner core.

According to various embodiments, at least a portion of the upper end of the inner core may be flat, and at least one boss is formed at the lower end of the inner core.

According to various embodiments, the inner core may be formed of at least one of metal or plastic.

According to various embodiments, the outer sheath may be formed at at least a portion of a side wall of the inner core, and is partially formed at a lower end of the inner core.

According to various embodiments, the outer sheath may be formed of at least one of silicon or rubber.

According to various embodiments, the window waterproof member may be disposed at a periphery of an external protective member of the display.

According to various embodiments, the electronic device may further include a speaker, a bracket, on which at least a portion of the speaker is seated and having at least a portion of a speaker sound hole, from which an audio signal generated by the speaker is output, a speaker hole formed on one side of the lower housing and aligned with the speaker sound hole and a speaker waterproof member configured to seal an aperture between at least part of the lower housing having the speaker hole and at least part of the bracket having the speaker hole.

According to various embodiments, the speaker waterproof member may include a speaker waterproof support aligned with the speaker hole of the lower housing and a center of which is opened, a speaker waterproof boss protruding from a bottom surface of the speaker waterproof support in a band shape and contacting at least a portion of the bracket and a bonding member fixing the speaker waterproof support to the lower housing.

According to various embodiments, the electronic device may further include a waterproof film configured to interrupt at least a portion between the speaker hole and the speaker sound hole while outputting the audio signal.

According to various embodiments, the electronic device may further include a microphone, a bracket including a microphone sound hole through which an audio signal related to an operation of the microphone moves, a microphone hole formed on one side of the lower housing and aligned with the microphone sound hole and a microphone waterproof member configured to seal an aperture between at least part of the lower housing having the microphone hole and at least part of the bracket having the microphone sound hole.

According to various embodiments, the microphone waterproof member may include a microphone waterproof support aligned with the microphone hole of the lower housing and a center of which is opened, a microphone waterproof boss protruding from the microphone waterproof support in a band shape and contacting the bracket, a bonding member fixing the microphone waterproof support to the lower housing and a stiffener film configured to support a strength of the microphone waterproof support.

According to various embodiments, the electronic device may further include a membrane disposed in an opened area formed at a central portion of the microphone waterproof support to interrupt introduction of moisture from the outside and discharge moisture in the interior of the electronic device to the outside.

According to various embodiments, the electronic device may further include an air vent hole formed on one side of the lower housing and related to adjustment of an internal pressure of the electronic device, a bracket disposed inside the lower housing and an air vent waterproof member configured to seal an aperture between one side of the bracket and one side of the lower housing having the air vent hole.

According to various embodiments, the air vent waterproof member may include an air vent waterproof support surrounding a periphery of the air vent hole, a bonding member fixing the air vent waterproof support to the lower housing and a membrane configured to interrupt introduction of moisture while blocking an opened area formed at a central portion of the air bent water proof support and maintaining introduction and discharge of the interior and exterior air.

According to various embodiments, the electronic device may further include an air vent waterproof boss protruding from the air vent waterproof support in a band shape and contacting one side of the bracket.

According to various embodiments, the electronic device may further include at least one sensor, a sensor hole formed on at least part of the lower housing and functioning as a passage, through which a signal related to an operation of the sensor is transmitted and received or air related to pressure flows and a sensor waterproof member configured to block the sensor hole and maintain the transmission and reception of the signal and the flow of the air.

According to various embodiments, the sensor waterproof member may include a bonding member surrounding at least a portion of a periphery of the sensor hole, a membrane configured to interrupt an opened area formed at a central portion of the bonding member, a sensor waterproof support facing the membrane while surrounding the sensor and a sensor waterproof boss formed on the sensor waterproof support in a band shape and contacting at least part of the membrane.

As described above, various embodiments may maintain the waterproof function in a high pressure state of a specific atmospheric pressure or more, and may firmly maintain a physical state related to performance of the functions of the electronic device.

What is claimed is:

1. An electronic device comprising:
    a display;
    an upper housing disposed on at least a portion of a periphery of the display;
    a lower housing coupled to the upper housing; and
    a window waterproof member disposed between at least a portion of a periphery of the display and the upper housing and sealing an aperture between the upper housing and the display,
    at least one sensor;
    a sensor hole formed on at least part of the lower housing and functioning as a passage, through which a signal related to an operation of the sensor is transmitted and received; and
    a sensor waterproof member configured to block the sensor hole and maintain the transmission and reception of the signal,
    wherein the sensor waterproof member includes:
    a bonding member surrounding at least a portion of a periphery of the sensor hole; and a membrane configured to interrupt an opened area formed at a central portion of the bonding member.

2. The electronic device of claim 1, further comprising:
an air vent hole formed on one side of the lower housing and related to adjustment of an internal pressure of the electronic device;
a bracket disposed inside the lower housing; and
an air vent waterproof member configured to seal an aperture between one side of the bracket and one side of the lower housing having the air vent hole.

3. The electronic device of claim 2, wherein the air vent waterproof member includes:
an air vent waterproof support surrounding a periphery of the air vent hole;
a bonding member fixing the air vent waterproof support to the lower housing; and
a membrane configured to interrupt introduction of moisture while blocking an opened area formed at a central portion of the air bent water proof support and maintaining introduction and discharge of the interior and exterior air.

4. The electronic device of claim 3, further comprising:
an air vent waterproof boss protruding from the air vent waterproof support in a band shape and contacting one side of the bracket.

5. The electronic device of claim 1, wherein the window waterproof member includes:
an inner core; and
an outer sheath including an outer peripheral surface and an inner peripheral surface,
wherein the outer peripheral surface of the outer sheath contacts at least part of the upper housing, and the inner peripheral surface of the outer sheath surrounds a side wall and a lower end of the inner core and the inner peripheral surface does not surround an upper end of the inner core,
wherein the window waterproof member is disposed at a periphery of an external protective member of the display, and
wherein the inner core minimizes torsion between the external protective member and the upper housing.

6. The electronic device of claim 5, wherein the upper end of the inner core is thicker than the lower end of the inner core.

7. The electronic device of claim 5, wherein at least a portion of the upper end of the inner core is flat, and at least one boss is formed at the lower end of the inner core.

8. The electronic device of claim 5, wherein the inner core is formed of at least one of metal or plastic.

9. The electronic device of claim 5, wherein the outer sheath is formed of at least a portion of the side wall of the inner core, and is partially formed at the lower end of the inner core.

10. The electronic device of claim 5, wherein the outer sheath is formed of at least one of silicon or rubber.

11. The electronic device of claim 1, wherein the sensor waterproof member includes:
a sensor waterproof support facing the membrane while surrounding the sensor; and
a sensor waterproof boss formed on the sensor waterproof support in a band shape and contacting at least part of the membrane.

12. An electronic device comprising:
a display;
an upper housing disposed on at least a portion of a periphery of the display;
a lower housing coupled to the upper housing;
a window waterproof member disposed between at least a portion of a periphery of the display and the upper housing and sealing an aperture between the upper housing and the display;
a speaker;
a bracket, on which at least a portion of the speaker is seated and having at least a portion of a speaker sound hole, from which an audio signal generated by the speaker is output;
a speaker hole formed on one side of the lower housing and aligned with the speaker sound hole; and
a speaker waterproof member configured to seal an aperture between at least part of the lower housing having the speaker hole and at least part of the bracket having the speaker hole,
wherein the window waterproof member includes:
an inner core; and
an outer sheath, and an outer peripheral surface of which contacts at least part of the upper housing and an inner peripheral surface of which contacts at least part of the display while the outer sheath surrounds at least a portion of the inner core.

13. The electronic device of claim 12, wherein the speaker waterproof member includes:
a speaker waterproof support aligned with the speaker hole of the lower housing and a center of which is opened;
a speaker waterproof boss protruding from a bottom surface of the speaker waterproof support in a band shape and contacting at least a portion of the bracket; and
a bonding member fixing the speaker waterproof support to the lower housing.

14. The electronic device of claim 13, further comprising:
a waterproof film configured to interrupt at least a portion between the speaker hole and the speaker sound hole while outputting the audio signal.

15. An electronic device comprising:
a display;
an upper housing disposed on at least a portion of a periphery of the display;
a lower housing coupled to the upper housing;
a window waterproof member disposed between at least a portion of a periphery of the display and the upper housing and sealing an aperture between the upper housing and the display;
a microphone;
a bracket including a microphone sound hole;
a microphone hole formed on one side of the lower housing and aligned with the microphone sound hole; and
a microphone waterproof member configured to seal an aperture between at least part of the lower housing having the microphone hole and at least part of the bracket having the microphone sound hole,
wherein the microphone waterproof member includes:
a microphone waterproof support aligned with the microphone hole of the lower housing and a center of which is opened,
a microphone waterproof boss protruding from the microphone waterproof support in a band shape and contacting the bracket, a bonding member fixing the microphone waterproof support to the lower housing, and a stiffener film configured to support a strength of the microphone waterproof support.

16. The electronic device of claim 15, further comprising:

a membrane disposed in an opened area formed at a central portion of the microphone waterproof support to interrupt introduction of moisture from the outside and discharge moisture in the interior of the electronic device to the outside.

* * * * *

UNITED STATES PATENT AND TRADEMARK OFFICE
CERTIFICATE OF CORRECTION

| | | |
|---|---|---|
| PATENT NO. | : 11,102,899 B2 | Page 1 of 1 |
| APPLICATION NO. | : 15/691016 | |
| DATED | : August 24, 2021 | |
| INVENTOR(S) | : Sung Eun Park et al. | |

It is certified that error appears in the above-identified patent and that said Letters Patent is hereby corrected as shown below:

On the Title Page

Item (72) Inventor:
"Jong Cheon WEE"
Should be:
--Jong Chun WEE--

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*